(12) United States Patent
Ueno

(10) Patent No.: US 11,844,252 B2
(45) Date of Patent: Dec. 12, 2023

(54) DISPLAY DEVICE

(71) Applicant: SHARP KABUSHIKI KAISHA, Sakai (JP)

(72) Inventor: Tetsuya Ueno, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 150 days.

(21) Appl. No.: 17/437,182

(22) PCT Filed: Mar. 29, 2019

(86) PCT No.: PCT/JP2019/014124
§ 371 (c)(1),
(2) Date: Sep. 8, 2021

(87) PCT Pub. No.: WO2020/202292
PCT Pub. Date: Oct. 8, 2020

(65) Prior Publication Data
US 2022/0173200 A1 Jun. 2, 2022

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *G09G 3/3266* (2013.01);
(Continued)

(58) Field of Classification Search
CPC ............................ G09G 3/3233; H10K 59/131
See application file for complete search history.

(56) References Cited

U.S. PATENT DOCUMENTS 7,724,216 B2 * 5/2010 Shin ..................... G09G 3/3233
345/82
8,994,709 B2 * 3/2015 Han ................... H10K 59/1315
438/34

(Continued)

FOREIGN PATENT DOCUMENTS

JP 2006-300980 A 11/2006
JP 2009-258301 A 11/2009

*Primary Examiner* — Sardis F Azongha
(74) *Attorney, Agent, or Firm* — ScienBiziP, P.C.

(57) ABSTRACT

This application discloses a current-driven display device able to suppress degradation in display quality due to a luminance gradient or the like caused by a voltage drop across a power supply line while avoiding an increase in size of the circuit as much as possible. In an organic EL display device, a high-level power supply line includes a main wiring line, trunk wiring lines branching off from the main wiring line and extending in a column direction, and branch wiring lines extending in a row direction along scanning signal lines, respectively. The trunk wiring lines and the branch wiring lines are formed in different layers from each other with an insulating layer interposed therebetween, where each branch wiring line is electrically connected conductively to at least one trunk wiring line through a contact hole, and each trunk wiring line is electrically connected conductively to only one branch wiring line through a contact hole. Each of pixel circuits is configured such that no current flows in a data write period thereof, so that no voltage drop is generated in the data write period across the corresponding branch wiring line and the trunk wiring line connected to the corresponding branch wiring line.

18 Claims, 16 Drawing Sheets

(51) Int. Cl.
*G09G 3/3266* (2016.01)
*G09G 3/3275* (2016.01)

(52) U.S. Cl.
CPC ... *G09G 3/3275* (2013.01); *G09G 2300/0842* (2013.01); *G09G 2310/0202* (2013.01); *G09G 2320/0233* (2013.01); *G09G 2330/02* (2013.01)

(56) References Cited

U.S. PATENT DOCUMENTS

| | | | |
|---|---|---|---|
| 9,584,799 B2* | 2/2017 | Lee | H04N 13/139 |
| 10,475,386 B2* | 11/2019 | Kim | G09G 3/3258 |
| 11,238,767 B2* | 2/2022 | Yuan | H01L 27/124 |
| 2007/0128583 A1 | 6/2007 | Miyazawa | |
| 2009/0256783 A1 | 10/2009 | Mizukoshi et al. | |
| 2014/0354624 A1* | 12/2014 | Chaji | G09G 3/3225 345/212 |

* cited by examiner

DISPLAY DEVICE

TECHNICAL FIELD

The disclosure relates to a display device, and more specifically, relates to a current-driven display device including a display element driven by a current (also referred to as an electric current in some cases), such as an organic electro luminescence (EL) display device.

BACKGROUND ART

The last few years have seen the implementation of organic EL display devices provided with a pixel circuit including organic EL elements (also referred to as organic light-emitting diodes (OLEDs)). The pixel circuit in such an organic EL display device includes a drive transistor, a write control transistor, and a holding capacitor in addition to the organic EL elements. A thin film transistor is used for the drive transistor and the write control transistor. The holding capacitor is connected to a gate terminal that serves as a control terminal of the drive transistor. A voltage corresponding to an image signal representing an image to be displayed (more specifically, a voltage indicating the gradation values of pixels to be formed by the pixel circuit, hereinafter referred to as "data voltage") is applied to the holding capacitor from the drive circuit via a data signal line. The organic EL element is a self-luminous display element that emits light with luminance according to an electric current flowing through the organic EL element. The drive transistor is connected to the organic EL element in series and controls the electric current passing through the organic EL element according to a voltage held by the holding capacitor.

In a display portion of the organic EL display device, a plurality of pixel circuits are arranged in a matrix shape, and a power supply line is disposed to supply a current to the organic EL element in each pixel circuit. Since the power supply line has wiring line resistance, a voltage drop occurs across the power supply line due to a current supplied to the organic EL element in the pixel circuit connected to the power supply line, and the voltage held by the holding capacitor of each pixel circuit is affected by the voltage drop. Because of this, even when the same data voltage is applied to each of the pixel circuits, the voltage held by the holding capacitor is slightly different from each other, so that the display luminance is somewhat different depending on a position in the display portion. This may be visually recognized as a luminance gradient in the displayed image, and a phenomenon in which such luminance gradient appears is also referred to as a "shading phenomenon".

To deal with this, PTL 1 discloses a light-emitting apparatus configured in such a manner that no current flows into a pixel circuit during a write period of a data voltage to a capacitance element (holding capacitor) in the pixel circuit, and a plurality of power supply lines are disposed along a plurality of scanning lines while intersecting a plurality of data lines (paragraphs [0028], [0029], and [0033]). According to this configuration, a phenomenon in which the voltage written to the capacitor element (holding capacitor) in the pixel circuit is affected by the voltage drop due to the current flowing through the power supply line, is suppressed (paragraphs [0033] to [0034]). PTL 2 discloses an active matrix display device provided with a current-driven self-light-emitting element for each of pixels arranged in a matrix shape. In order to suppress a voltage drop to a minimum level of drop during data write to the pixels, the disclosed display device is configured in such a manner that a vertical PVDD line (vertical power supply line) that supplies power to a horizontal PVDD line (horizontal power supply line) along a target row for writing differs from a vertical PVDD line that supplies power to a horizontal PVDD line of another row (paragraphs [0031] to [0034], and the like).

CITATION LIST

Patent Literature

PTL 1: JP 2006-300980 A
PTL 2: JP 2009-258301 A

SUMMARY

Technical Problem

However, in the configuration described in PTL 1, a voltage drop occurs across a main power supply line disposed to supply a power supply voltage from a power supply circuit to the plurality of power supply lines disposed along the plurality of scanning lines, whereby the write voltage to the holding capacitor of the pixel circuit is affected. In the configuration disclosed in PTL 2, a circuit to switch the vertical PVDD line to which the horizontal PDVV line is connected in response to the switching of a gate line (scanning signal line) to be selected, is additionally needed (paragraphs [0033] to [0034]). Unfortunately, a configuration for suppressing the influence of the voltage drop across the horizontal PDVV line on the write voltage is not specifically described in PTL 2.

In a current-driven display device such as an organic EL display device, it is desired to suppress degradation in display quality due to a luminance gradient or the like caused by a voltage drop across a power supply line while avoiding an increase in size of the circuit as much as possible.

Solution to Problem

A display device according to some embodiments of the disclosure is a display device including a display portion in which a plurality of scanning signal lines extending in a row direction, a plurality of data signal lines extending in a column direction and intersecting the plurality of scanning signal lines, and a plurality of pixel circuits arranged in a matrix shape along the plurality of scanning signal lines and the plurality of data signal lines are provided, the display device includes:
  power supply lines including a first power supply voltage line and a second power supply voltage line;
  a data signal line drive circuit configured to drive the plurality of data signal lines; and
  a scanning signal line drive circuit configured to selectively drive the plurality of scanning signal lines; the first power supply voltage line includes;
  a main wiring line provided in a frame region adjacent to the display portion and extending in the row direction;
  a plurality of trunk wiring lines branching off from the main wiring line and extending in the column direction; and
  a plurality of branch wiring lines each disposed along each of the plurality of scanning signal lines,
  wherein each of the plurality of pixel circuits corresponds to any one of the plurality of scanning signal lines, to any one of the plurality of data signal lines, and to any one of the plurality of branch wiring lines, and includes a display element driven by a current, a holding capacitor configured to hold a data voltage for controlling a drive current of the display element, and a drive transistor configured to control the drive current of the display element in accordance with the data voltage held in the holding capacitor, in each of the plurality of pixel circuits, a first conduction terminal of the drive transistor is connected to the branch wiring line corresponding to the pixel circuit, a second conduction terminal of the drive transistor is connected to the second power supply voltage line via the display element, and a control terminal of the drive transistor is connected to the corresponding branch wiring line via the holding capacitor, and the display portion includes, a wiring line layer in which the plurality of branch wiring lines are formed, a wiring line layer in which the plurality of trunk wiring lines are formed, an insulating layer sandwiched between the plurality of branch wiring lines and the plurality of trunk wiring lines, and contact holes provided in the insulating layer in such a manner that each of the plurality of branch wiring lines is electrically connected conductively to at least one trunk wiring line among the plurality of trunk wiring lines, and each of the plurality of trunk wiring lines is electrically connected conductively to only some branch wiring lines among the plurality of branch wiring lines.

Advantageous Effects of Disclosure

In some of the embodiments of the disclosure, the first power supply voltage line includes the main wiring line provided in the frame region adjacent to the display portion and extending in the row direction (extending direction of the scanning signal line), the plurality of trunk wiring lines branching off from the main wiring line and extending in the column direction (extending direction of the data signal line), and the plurality of branch wiring lines each disposed along each of the plurality of scanning signal lines, and is configured such that each of the plurality of branch wiring lines is electrically connected conductively to at least one trunk wiring line among the plurality of trunk wiring lines, and each of the plurality of trunk wiring lines is electrically connected conductively to only some branch wiring lines among the plurality of branch wiring lines. Accordingly, by making each pixel circuit have a configuration in which no current flows therethrough during the data voltage write period, not only no current flows through the branch wiring line connected to the pixel circuit to be written with the data voltage, but also no current flows through the trunk wiring line connected to the branch wiring line or the amount of current is significantly reduced even when the current flows in comparison with known configurations. As a result, when the data voltage is written to each pixel circuit, a decrease in the power supply voltage supplied by the first power supply voltage line to the pixel circuit may be more largely suppressed than in known techniques. Thus, according to some of the embodiments of the disclosure, it is possible to suppress the degradation in display quality due to a luminance gradient or the like caused by the voltage drop across the power supply line while avoiding the increase in size of the circuit as much as possible.

DESCRIPTION OF EMBODIMENTS

In the following, each embodiment will be described with reference to the accompanying drawings. Note that in each of the transistors referred to below, the gate terminal corresponds to a control terminal, one of a drain terminal and a source terminal corresponds to a first conduction terminal, and the other corresponds to a second conduction terminal. All the transistors in each embodiment are described as P-channel transistors, but the disclosure is not limited thereto. Furthermore, the transistor in each embodiment is, for example, a thin film transistor, but the disclosure is not limited thereto. The term "connection" used herein means an "electrical connection" unless otherwise specified, and without departing from the spirit and scope of the disclosure, the term includes not only a case in which a direct connection is meant but also a case in which an indirect connection via another element such as a transistor is meant.

1. First Embodiment 1.1 Overall Configuration

Figure 1:
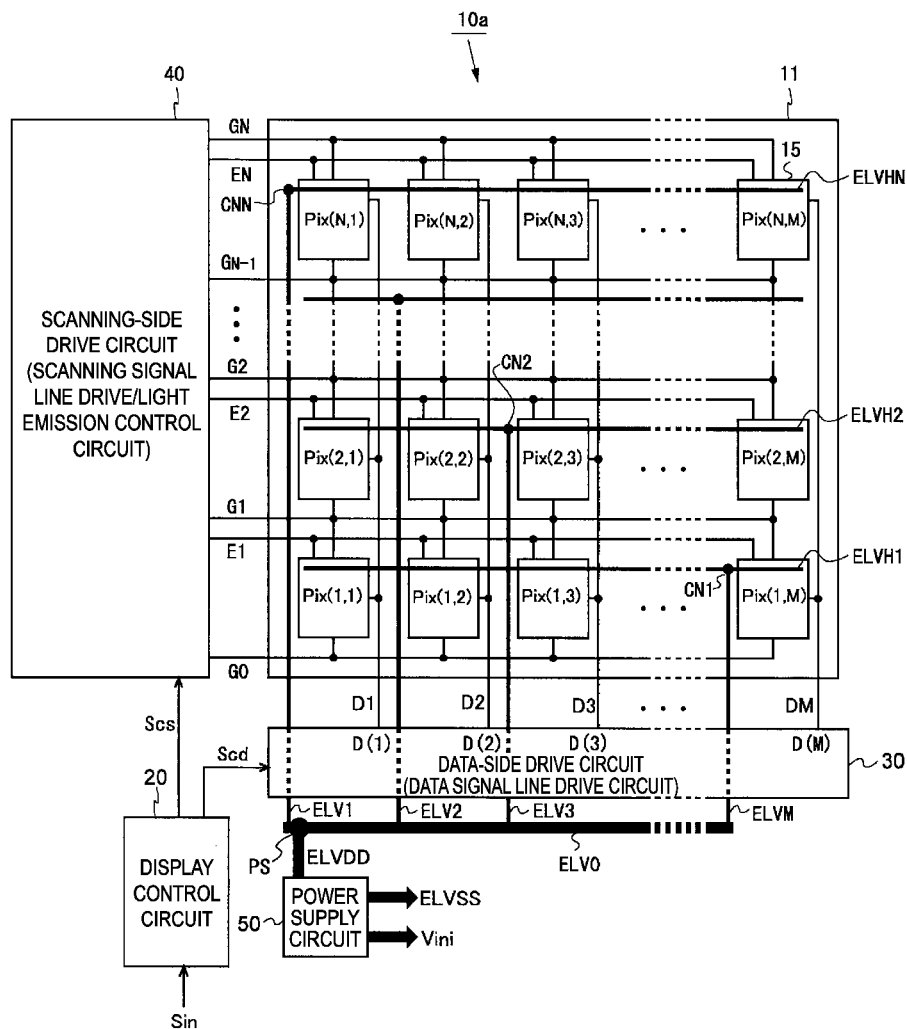
FIG. 1 is a block diagram illustrating an overall configuration of a display device according to a first configuration example of a first embodiment.

FIG. 1 is a block diagram illustrating an overall configuration of an organic EL display device 10a according to a first configuration example of a first embodiment. The display device 10a is an organic EL display device configured to perform internal compensation (details will be described below).

As illustrated in FIG. 1, the display device 10a includes a display portion 11, a display control circuit 20, a data-side drive circuit 30, a scanning-side drive circuit 40, and a power supply circuit 50. The data-side drive circuit functions as a data signal line drive circuit (also referred to as a "data driver"). The scanning-side drive circuit 40 functions as a scanning signal line drive circuit (also referred to as a "gate driver") and a light emission control circuit (also referred to as an "emission driver"). These two drive circuits are configured as one scanning-side drive circuit 40 in the configuration illustrated in FIG. 1, but a configuration where the two drive circuits are separated as needed, or a configuration where the two drive circuits are disposed separately on different sides of the display portion 11 may be adopted. At least part of the scanning-side drive circuit and data-side drive circuit may be integrally formed with the display portion 11. The same applies to other configuration examples described later, other embodiments described later, and modification examples thereof. The power supply circuit 50 generates a high-level power supply voltage ELVDD, a low-level power supply voltage ELVSS, and an initialization voltage Vini, which will be described later, to be supplied to the display portion 11, and generates power supply voltages (not illustrated) to be supplied to the display control circuit 20, the data-side drive circuit 30, and the scanning-side drive circuit 40.

In the display portion 11, there are disposed M (M is an integer of not less than two) data signal lines D1 to DM and N+1 (N is an integer of not less than two) scanning signal lines G0 to GN intersecting the data signal lines D1 to DM, and there are disposed N light emission control lines (also referred to as "emission lines") E1 to EN along N scanning signal lines G1 to GN, respectively. As illustrated in FIG. 1, the display portion 11 is provided with M×N pixel circuits 15. The M×N pixel circuits 15 are arranged in a matrix shape along the M data signal lines D1 to DM and the N scanning signal lines G1 to GN. Each of the pixel circuits 15 corresponds to any one of the M data signal lines D1 to DM and to any one of the N scanning signal lines G1 to GN (hereinafter, when distinguishing the pixel circuits 15, a pixel circuit corresponding to the i-th scanning signal line Gi and to the j-th data signal line Dj will be referred to as a "pixel circuit in an i-th row and a j-th column", and will be denoted by the reference sign "Pix(i, j)"). The N light emission control lines E1 to EN correspond to the N scanning signal lines G1 to GN, respectively. Accordingly, each pixel circuit 15 also corresponds to any one of the N light emission control lines E1 to EN. In the following description, an extending direction of the scanning signal line Gi is referred to as a "row direction", and an extending direction of the data signal line is referred to as a "column direction".

In the display portion 11, power supply lines common to each of the pixel circuits 15 are disposed. In other words, a power supply line to supply the high-level power supply voltage ELVDD for driving the organic EL element (hereinafter, referred to as a "high-level power supply line" or a "first power supply voltage line", and denoted by the same reference sign "ELVDD" as that of the high-level power supply voltage), and a power supply line (not illustrated) to supply the low-level power supply voltage ELVSS for driving the organic EL element (hereinafter, referred to as a "low-level power supply line" or a "second power supply voltage line", and denoted by the same reference sign "ELVSS" as that of the low-level power supply voltage) are disposed.

As illustrated in FIG. 1, the high-level power supply line ELVDD includes one main wiring line ELV0 extending in the row direction, M trunk wiring lines ELV1 to ELVM branching off from the main wiring line ELV0 and extending in the column direction (extending direction of the data signal lines), and N branch wiring lines ELVH1 to ELVHN disposed along the scanning signal lines G1 to GN, respectively. The high-level power supply line ELVDD is configured such that one or more trunk wiring lines ELVj are electrically connected conductively to each of the branch wiring lines ELVHi, and only one branch wiring line ELVHi is electrically connected conductively to each of the trunk wiring lines ELVj (i=1 to N, j=1 to M, M>N). Note that in the example illustrated in FIG. 1, the trunk wiring lines ELV1 to ELVN and the branch wiring lines ELVH1 to ELVHN correspond to each other on a one-to-one basis, but the number of trunk wiring lines may be greater than the number of branch wiring lines, and one or more of the trunk wiring lines ELVj may be electrically connected conductively to each of the branch wiring lines ELVHi. In the following, the connection between the trunk wiring line ELVj and the branch wiring line ELVHi refers to an electrical conduction connection (the same applies to other embodiments) unless otherwise indicated. Here, "being electrically connected conductively", or "electrical conduction connection" refers to an electrical connection brought by a conductor with a negligible level of voltage drop, and includes, for example, a case where wiring lines in different wiring line layers make contact and electrically connect to each other via a contact hole, or a case where wiring lines in the same wiring line layer are branched, that is, a case where a wiring line branches off, as a branch wiring line, from a trunk wiring line in the same wiring line layer as the trunk wiring line, and the trunk wiring line and the branch wiring line are electrically connected to each other. As described below, in the present embodiment and other embodiments, the trunk wiring lines ELVj and the branch wiring lines ELVHi are formed in mutually different wiring line layers with an insulating layer interposed therebetween, and the connections (electrical conduction connections) between the trunk wiring lines ELVj and the branch wiring lines ELVHi are achieved through contact holes CHi provided in the insulating layer (see FIGS. 10 and 11).

In the present configuration example, the high-level power supply voltage ELVDD is supplied from the power supply circuit 50 to one end portion of the main wiring line ELV0 of the power supply line. More specifically, in the main wiring line ELV0, a position PS (hereinafter, referred to as a "power supply point"), where the high-level power supply voltage ELVDD is supplied from the power supply circuit 50, is a position at which the first trunk wiring line ELV1 branches off from the main wiring line ELV0 or a position near the above-described position, as illustrated in FIG. 1. In the present configuration example, since a distance from the main wiring line ELV0 to each scanning signal line increases in order from the first scanning signal line G1 toward the N-th scanning signal line GN, a distance from the main wiring line ELV0 to a connection point CNi between the trunk wiring line ELVj and the branch wiring line ELVHi (that is, the length of the trunk wiring line ELVj) increases as the location of the trunk wiring line ELVj is closer to the power supply point PS of the main wiring line ELV0. This suppresses a difference in path length between the pixel circuits of the power supply lines from the power supply circuit 50 to each of the pixel circuits 15. Note that the branch wiring lines ELVH1 to ELVHN and the trunk wiring lines ELV1 to ELVM are formed in the display portion 11, and the main wiring line ELV0 is formed as a wiring line extending in the row direction in a frame region adjacent to the display portion 11 as a display region where the M×N pixel circuits 15 are arranged in a display panel (including the display portion 11) (the same applies to other embodiments).

Each pixel circuit 15 corresponds to any one of the N branch wiring lines ELVH1 to ELVHN. The above-described various signal lines and power supply lines, and thin film transistors (TFTs) are formed in a layered structure in the display portion 11 (see FIGS. 10 and 11 described below). The display portion 11 also includes a not illustrated initialization voltage supply line (denoted by the same reference sign "Vini" as that of the initialization voltage) for supplying the initialization voltage Vini used in a reset operation for initializing each pixel circuit 15 (details thereof will be described later). The high-level power supply voltage ELVDD, the low-level power supply voltage ELVSS, and the initialization voltage Vini are supplied from the power supply circuit 50.

The display control circuit 20 receives an input signal Sin including image information representing an image to be displayed and timing control information for image display from outside of the display device 10a and, based on the input signal Sin, generates a data-side control signal Scd and a scanning-side control signal Scs, and outputs the data-side control signal Scd to the data-side drive circuit (data signal line drive circuit) 30 and outputs the scanning-side control signal Scs to the scanning-side drive circuit (scanning signal line drive/light emission control circuit) 40.

The data-side drive circuit 30 drives the data signal lines D1 to DM based on the data-side control signal Scd from the display control circuit 20. More specifically, the data-side drive circuit 30 outputs in parallel M data signals D(1) to D(M) representing the image to be displayed, and applies the data signals D(1) to D(M) to the data signal lines D1 to DM, respectively, based on the data-side control signal Scd.

The scanning-side drive circuit 40 functions, based on the scanning-side control signal Scs from the display control circuit 20, as a scanning signal line drive circuit that drives the scanning signal lines G0 to GN and a light emission control circuit that drives the light emission control lines E1 to EN. More specifically, when functioning as the scanning signal line drive circuit, the scanning-side drive circuit 40 sequentially selects the scanning signal lines G0 to GM in individual frame periods based on the scanning-side control signal Scs, and applies an active signal (low-level voltage) to a selected scanning signal line Gk and a non-active signal (high-level voltage) to unselected scanning signal lines. With this, M pixel circuits Pix(n, 1) to Pix(n, M) corresponding to the selected scanning signal line Gn ($1 \leq n \leq N$) are collectively selected. As a result, in a select period of the scanning signal line Gn (hereinafter referred to as an "n-th scanning select period"), the voltages of the M data signals D(1) to D(M) applied to the data signal lines D1 to DM from the data-side drive circuit 30 (hereinafter, referred to as simply "data voltages" when not distinguished from each other) are written as pixel data to the pixel circuits Pix(n, 1) to Pix(n, M), respectively. Note that in the following description, the scanning signal lines G0 to GN are selected in ascending order.

When functioning as the light emission control circuit, the scanning-side drive circuit 40 applies, based on the scanning-side control signal Scs, a light emission control signal indicating non-light emission (high-level voltage) to the i-th light emission control line Ei at least during an $i-1^{th}$ horizontal period and an i-th horizontal period, and applies a light emission control signal indicating light emission (low-level voltage) to the i-th light emission control line Ei during other periods. The organic EL elements in the pixel circuits Pix(i, 1) to Pix(i, M) corresponding to the i-th scanning signal line Gi emit light with luminance corresponding to the data voltages having been written to the pixel circuits Pix(i, 1) to Pix(i, M), respectively, while the voltage of the light emission control line Ei is at a low level, that is, while the light emission control line Ei is in an active state.

1.2. Configuration and Operation of Pixel Circuit

Figure 2:
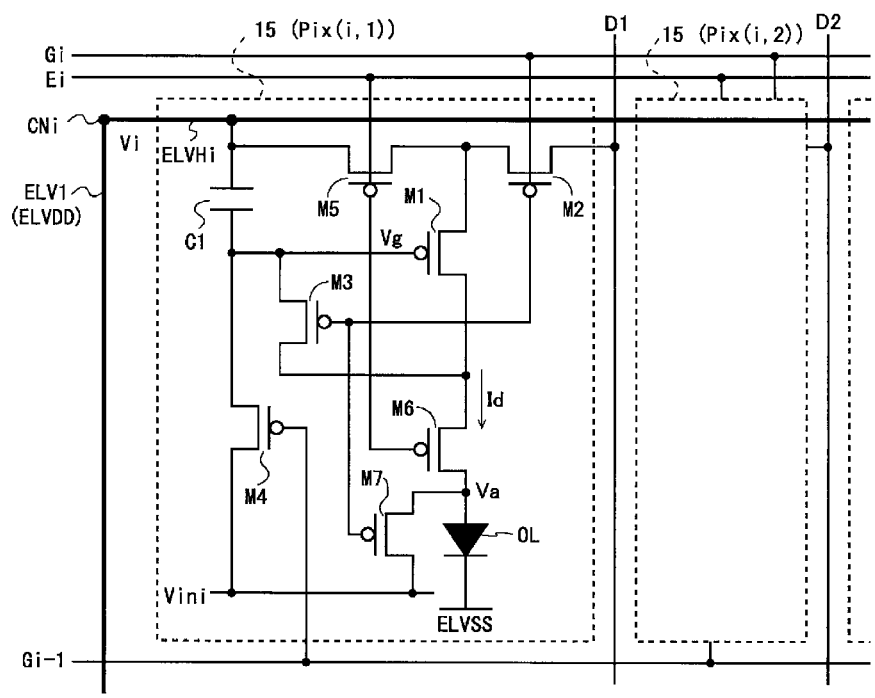
FIG. 2 is a circuit diagram illustrating a configuration of a pixel circuit in the first embodiment.

FIG. 2 is a circuit diagram illustrating a configuration of the pixel circuit 15 in the present embodiment. FIG. 2 illustrates the configuration of the pixel circuit 15 corresponding to the i-th scanning signal line Gi and the first data signal line D1, that is, the configuration of the pixel circuit Pix(i, 1) in the i-th row and the first column ($1 \leq i \leq N$). The other pixel circuits 15 also have the same configuration. Hereinafter, while taking the pixel circuit Pix(i, 1) in the i-th row and the first column as an example, the configuration of the pixel circuit 15 of the present embodiment will be described. Hereinafter, M pixel circuits Pix(i, 1) to Pix(i, M) corresponding to the i-th scanning signal line Gi are referred to as "pixel circuits in the i-th row" or an "i-th pixel circuit row". Any of the pixel circuits Pix(i, 1) to Pix(i, M) configuring the i-th pixel circuit row is connected to the i-th branch wiring line ELVHi.

As illustrated in FIG. 2, the pixel circuit 15 includes an organic EL element OL as a display element, a drive transistor M1, a write control transistor M2, a threshold compensation transistor M3, a first initialization transistor M4, a first light emission control transistor M5, a second light emission control transistor M6, a second initialization transistor M7, and a holding capacitor C1. In the pixel circuit 15, the transistors M2 to M7 other than the drive transistor M1 function as switching elements.

To the pixel circuit 15, the scanning signal line Gi corresponding thereto (hereinafter, also referred to as the "corresponding scanning signal line" in the description focusing on the pixel circuit), the scanning signal line Gi−1 immediately before the corresponding scanning signal line Gi (an immediately preceding scanning signal line in the scanning order of the scanning signal lines G1 to GN, and hereinafter, it is also referred to as the "preceding scanning signal line" in the description focusing on the pixel circuit), the light emission control line Ei corresponding thereto (hereinafter, also referred to as the "corresponding light emission control line" in the description focusing on the pixel circuit), the data signal line Dj corresponding thereto (hereinafter also referred to as the "corresponding data signal line" in the description focusing on the pixel circuit), the initialization voltage supply line Vini, the high-level power supply line ELVDD, and the low-level power supply line ELVSS are connected. Here, the high-level power supply line ELVDD connected to the pixel circuit 15 is, when more specifically indicated, the branch wiring line ELVHi corresponding to the pixel circuit 15 (hereinafter, also referred to as the "corresponding branch wiring line" in the description focusing on the pixel circuit) among the N branch wiring lines ELVH1 to ELVHN included in the high-level power supply line ELVDD, that is, the i-th branch wiring line ELVHi (also referred to as the "branch wiring line in the i-th row"). As described above, the i-th branch wiring line ELVHi is connected to at least one trunk wiring line ELVj among the trunk wiring lines ELV1 to ELVN branching off from the main wiring line ELV0. Accordingly, the high-level power supply voltage ELVDD is supplied from the power supply circuit 50 to each pixel circuit 15 via the main wiring line ELV0, the trunk wiring line ELVj, and the corresponding branch wiring line ELVHi in sequence.

As illustrated in FIG. 2, in the pixel circuit 15, a source terminal of the drive transistor M1 serving as a first conduction terminal is connected to the corresponding data signal line Dj via the write control transistor M2 and to the high-level power supply line ELVDD via the first light emission control transistor M5 (more specifically, to the corresponding branch wiring line ELVHi). A drain terminal of the drive transistor M1 serving as a second conduction terminal is connected to an anode electrode of the organic EL element OL via the second light emission control transistor M6, and is connected to the low-level power supply line ELVSS via the organic EL element OL. A gate terminal of the drive transistor M1 serving as a control terminal is connected to the high-level power supply line ELVDD (the corresponding branch wiring line ELVHi) via the holding capacitor C1, connected to the drain terminal of the drive transistor M1 serving as the second conduction terminal via the threshold compensation transistor M3, and connected to the initialization voltage supply line Vini via the first initialization transistor M4. The anode electrode of the organic EL element OL is connected to the initialization voltage supply line Vini via the second initialization transistor M7, and a cathode electrode of the organic EL element OL is connected to the low-level power supply line ELVSS. Gate terminals of the write control transistor M2, the threshold compensation transistor M3, and the second initialization transistor M7 are connected to the corresponding scanning signal line Gi. Gate terminals of the first and second light emission control transistors M5 and M6 are connected to the corresponding light emission control line Ei. A gate terminal of the first initialization transistor M4 is connected to the preceding scanning signal line Gi−1.

The drive transistor M1 operates in a saturation region. A drive current Id flowing through the organic EL element OL in the light emission period is given by Equation (1) below. A gain β of the drive transistor M1 included in Equation (1) is given by Equation (2) below.

$$Id = (\beta/2) \cdot (|Vgs| - |Vth|)^2 = (\beta/2) \cdot (|Vg - ELVDD| - |Vth|)^2 \quad (1)$$

$$\beta = \mu \times (W/L) \times Cox \quad (2)$$

In Equations (1) and (2), Vth, μ, W, L, and Cox represent the threshold voltage, mobility, gate width, gate length, and gate insulating film capacitance per unit area of the drive transistor M1, respectively.

Figure 3:
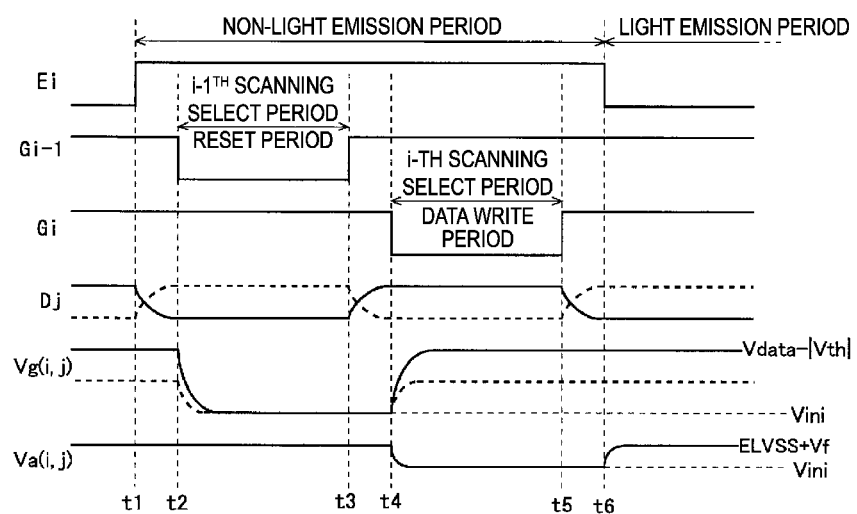
FIG. 3 is a signal waveform diagram for describing the drive of a display device according to the first embodiment.

FIG. 3 is a signal waveform diagram for describing the drive of the display device according to the present embodiment, and illustrates changes in voltages of the signal lines (the corresponding light emission control line Ei, preceding scanning signal line Gi−1, corresponding scanning signal line Gi, and corresponding data signal line Dj), a change in a voltage Vg of the gate terminal of the drive transistor M1 (hereinafter, referred to as "gate voltage"), and a change in a voltage Va of the anode electrode of the organic EL element OL (hereinafter, referred to as "anode voltage"), in an initialization operation, a data write operation, and a lighting operation of the pixel circuit Pix(i, j) in the i-th row and the j-th column. In FIG. 3, the period from time t1 to time t6 represents a non-light emission period of the pixel circuits Pix(i, 1) to Pix(i, M) in the i-th row. The period from the time t2 to the time t4 is the i−$1^{th}$ horizontal period, and the period from the time t2 to the time t3 is the select period of the i−$1^{th}$ scanning signal line (preceding scanning signal line) Gi−1 (hereinafter, referred to as an "i−$1^{th}$ scanning select period"). The i−$1^{th}$ scanning select period corresponds to a reset period of the pixel circuits Pix(i, 1) to Pix(i, M) in the i-th row. The period from the time t4 to the time t6 is the i-th horizontal period, and the period from the time t4 to the time t5 is the select period of the i-th scanning signal line (corresponding scanning signal line) Gi (hereinafter, referred to as "i-th scanning select period"). The i-th scanning select period corresponds to the data write period of the pixel circuits Pix(i, 1) to Pix(i, M) in the i-th row.

In the pixel circuit Pix(i, j) in the i-row and the j-th column, as illustrated in FIG. 3, when the voltage of the light emission control line Ei changes from the low level to the high level at the time t1, the first and second light emission control transistors M5 and M6 change from an on state to an off state, so that the organic EL element OL is brought into the non-light emission state. During the period from the time t1 to the start time t2 of the i−$1^{th}$ scanning select period, the data-side drive circuit 30 starts to apply the data signal D(j), which is a data voltage of the pixel in the i−$1^{th}$ row and the j-th column, to the data signal line Dj. In the pixel circuit Pix(i, j), the write control transistor M2 connected to the data signal line Dj is in the off state.

At the time t2, the voltage of the preceding scanning signal line Gi−1 changes from the high level to the low level, which causes the preceding scanning signal line Gi−1 to enter a select state. Due to this change, the first initialization transistor M4 enters the on state. Thus, the voltage of the gate terminal of the drive transistor M1, that is, the gate voltage Vg is initialized to the initialization voltage Vini. The initialization voltage Vini is such a voltage that the voltage can keep the drive transistor M1 in the on state during the writing of the data voltage to the pixel circuit Pix(i, j). More specifically, the initialization voltage Vini satisfies Relationship (3) below.

$$|Vini - Vdata| > |Vth| \quad (3)$$

In this case, Vdata represents the data voltage (voltage of the corresponding data signal line Dj), and Vth represents the threshold voltage of the drive transistor M1. Further, because the drive transistor M1 in the present embodiment is a P-channel transistor, the following relationship is satisfied.

$$Vini < Vdata \quad (4)$$

By initializing the gate voltage Vg with such initialization voltage Vini, the data voltage may be reliably written to the pixel circuit Pix(i, j). Note that the initialization of the gate voltage Vg is also the initialization of the holding voltage of the holding capacitor C1.

The period from the time t2 to time t3 is a reset period in the pixel circuits Pix(i, 1) to Pix(i, M) in the i-th row. In the pixel circuit Pix(i, j), the gate voltage Vg is initialized by the first initialization transistor M4 being in the on state in the reset period as described above. FIG. 3 illustrates a change in a gate voltage Vg(i, j) in the pixel circuit Pix(i, j) at this time. Note that the reference sign "Vg(i, j)" is used for differentiating the gate voltage Vg in the pixel circuit Pix(i, j) from the gate voltage Vg in other pixel circuits (the same applies hereinafter).

At the time t3, the voltage of the preceding scanning signal line Gi−1 changes to the high level, which causes the preceding scanning signal line Gi−1 to enter a non-select state. Therefore, the first initialization transistor M4 changes to the off state. During the period from the time t3 to the start time t4 of the i-th scanning select period, the data-side drive circuit 30 starts to apply the data signal D(j), which is a data voltage of the pixel in the i-th row and the j-th column, to the data signal line Dj, and the application of the data signal D(j) is continued until reaching at least the end time t5 of the i-th scanning select period.

At the time t4, the voltage of the corresponding scanning signal line Gi changes from the high level to the low level, which causes the corresponding scanning signal line Gi to enter a select state. Because of this, the write control transistor M2 changes to the on state. The threshold compensation transistor M3 also changes to the on state, and hence the drive transistor M1 is in a state in which the gate terminal and the drain terminal of the drive transistor M1 are connected, that is, in a diode-connected state. As a result, the voltage of the corresponding data signal line Dj, that is, the voltage of the data signal D(j) is applied to the holding capacitor C1 as the data voltage Vdata via the drive transistor M1 in the diode-connected state. As a result, as illustrated in FIG. 3, the gate voltage Vg(i, j) changes toward the value given by Equation (5) below.

$$Vg(i, j) = Vdata - |Vth| \quad (5)$$

At the time t4, the voltage of the corresponding scanning signal line Gi changes from the high level to the low level, which causes the second initialization transistor M7 to change to the on state. As a result, accumulated charge in parasitic capacitance of the organic EL element OL is discharged and the anode voltage Va of the organic EL element OL is initialized to the initialization voltage Vini (see FIG. 3). Note that the reference sign "Va(i, j)" is used for differentiating the anode voltage Va in the pixel circuit Pix(i, j) from the anode voltage Va in other pixel circuits (the same applies hereinafter).

The period from the time t4 to time t5 is a data write period of the pixel circuits Pix(i, 1) to Pix(i, M) in the i-th row. In the pixel circuit Pix(i, j), a data voltage that has experienced threshold compensation is written to the holding capacitor C1 in the manner described above in the data write period, and the gate voltage Vg(i, j) takes a value given by Equation (5) described above.

Then, at the time t6, the voltage of the light emission control line Ei changes to a low level. Accordingly, the first and second light emission control transistors M5 and M6 change to the on state. Because of this, after the time t6, the current Id flows from the corresponding branch wiring line ELVHi of the high-level power supply line ELVDD to the low-level power supply line ELVSS via the first light emission control transistor M5, the drive transistor M1, the second light emission control transistor M6, and the organic EL element OL. This current Id is given by Equation (1) described above. Considering that the drive transistor M1 is a P-channel transistor and a relation of ELVDD>Vg is satisfied, the current Id is given by the following Equation from Equations (1) and (5) described above.

$$Id = (\beta/2) \cdot (ELVDD - Vg - |Vth|)^2 = (\beta/2) \cdot (ELVDD - Vdata)^2 \quad (6)$$

As described above, after the time t6, the organic EL element OL emits light at the luminance corresponding to the data voltage Vdata, which is the voltage of the corresponding data signal line Dj in the i-th scanning select period, regardless of the threshold voltage Vth of the drive transistor M1.

1.3 Effect of First Configuration Example

As illustrated in FIG. 2, in the pixel circuit 15 of the present embodiment, the gate terminal of the drive transistor M1 is connected to the corresponding branch wiring line ELVHi of the high-level power supply line ELVDD via the holding capacitor C1, the source terminal of the drive transistor M1 is connected to the corresponding branch wiring line ELVHi of the high-level power supply line ELVDD via the first light emission control transistor M5, and the first light emission control transistor M5 is in the on state in the light emission period. In this pixel circuit 15, the current Id corresponding to a difference between the voltage supplied to one end of the holding capacitor C1 from the corresponding data signal line Dj in the i-th scanning select period of the non-light emission period and the voltage of the corresponding branch wiring line ELVHi connected to the other end of the holding capacitor C1, flows through the organic EL element OL in the light emission period. It has been noted above that this current Id is given by Equation (6). In Equation (6), it is assumed that the voltage of the other end of the holding capacitor C1 in the data write period, in other words, the i-th scanning select period of the non-light emission period, that is, the voltage of the corresponding branch wiring line ELVHi is equal to the high-level power supply voltage ELVDD. However, in the i-th scanning select period, which is a data write period of the pixel circuit 15 connected to the i-th scanning signal line Gi and the j-th data signal line Dj, in other words, the data write period of the pixel circuit Pix(i, j) in the i-th row and the j-th column, when a current flows through a path of the power supply line from the power supply circuit 50 to the pixel circuit Pix(i, j), the voltage of the corresponding branch wiring line ELVHi actually has a lower value than that of the high-level power supply voltage VDD due to a voltage drop brought about by the current.

As illustrated in FIG. 3, in the i-th scanning select period, which is the data write period of the pixel circuit Pix(i, j) in the i-th row and j-th column, the i-th light emission control line Ei is set to a high level (deactivated state) by the light emission control circuit, whereby the pixel circuits 15 connected to the corresponding branch wiring line ELVHi, that is, the pixel circuits Pix(i, 1) to Pix(i, M) in the i-th row are set to be in a non-light emission state. The pixel circuits Pix(i+1, 1) to Pix(i+1, M) in the i+1$^{th}$ row are also in the non-light emission state because the i-th scanning select period corresponds to the reset period thereof. The pixel circuits Pix(p, 1) to Pix(p, M) in the rows other than the above-described rows (1≤p≤N, p≠i, and p≠i+1) are in a light emission state. Because of this, in the data write period of the pixel circuit Pix(i, j) in the i-th row and the j-th column, no current flows through the branch wiring line ELVHi in the i-th row corresponding to the above pixel circuit. However, in accordance with a current that flows through each of the Pix circuits (p, 1) to Pix(p, M) in the light emission state ($1 \leq p \leq N$, $p \neq i$, and $p \neq i+1$), a current flows through the corresponding branch wiring line ELVHp of those pixel circuits.

However, in the present configuration example illustrated in FIG. 1, only one branch wiring line ELVHi is connected to each of the trunk wiring lines ELVj (j=1 to M). Due to this, other branch wiring lines are not connected to the trunk wiring line ELVk connected to the i-th row branch wiring line (corresponding branch wiring line) ELVHi connected to the pixel circuit Pix(i, j) in the i-th row and the j-th column. Thus, in the data write period of the pixel circuit Pix(i, j) in the i-th row and the j-th column (the i-th scanning select period), not only does no current flow through the branch wiring line ELVHi in the i-th row corresponding to the above pixel circuit, but also no current flows through the trunk wiring line ELVk connected to the branch wiring line ELVHi in the i-th row and no voltage drop is generated across the branch wiring line ELVHi and the trunk wiring line ELVk. As a result, the voltage drop across the corresponding branch wiring line ELVHi in the data write period of the pixel circuit Pix(i, j) in the i-th row and the j-th column (voltage drop from the high-level power supply voltage ELVDD) is caused by only voltage drops across the main wiring line ELV0 and in a path from the power supply circuit 50 to the main wiring line ELV0 among the power supply lines. The main wiring line ELV0 and the path described above may be formed as wiring lines with sufficiently low wiring line resistance from the perspective of the arrangement space compared to the branch wiring lines ELVH1 to ELVHN and the trunk wiring lines ELV1 to ELVM disposed in the display portion 11. Accordingly, the high-level power supply voltage ELVDD with substantially no voltage drop may be supplied in the data write period from the corresponding branch wiring line ELVHi to the pixel circuit Pix(i, j) in the i-th row and the j-th column. This also applies to other pixel circuits Pix(p, q) ($1 \leq p \leq N$, and $p \neq i$; $1 \leq q \leq M$, and $q \neq j$), where the high-level power supply voltage ELVDD with substantially no voltage drop may be supplied in the data write period from the corresponding branch wiring line ELVHp to the other pixel circuits Pix(p, q).

According to the present configuration example described above, it is possible to supply the high-level power supply voltage ELVDD with substantially no voltage drop from the corresponding branch wiring line to each of the pixel circuits 15 in the data write period thereof. In the present configuration example, a circuit for compensating for a voltage drop brought about by a current in a power supply line such as a trunk wiring line, processing for correcting the image data, and the like are unnecessary. Accordingly, it is possible to suppress the degradation in display quality due to a luminance gradient or the like caused by the voltage drop across the power supply line while avoiding the increase in size of the circuit and the like as much as possible.

1.4 Other Configuration Examples

Hereinafter, organic EL display devices according to other configuration examples (a second configuration example to a fourth configuration example) of the present embodiment will be described with reference to FIGS. 4 to 7.

1.4.1 Second Configuration Example

Figure 4:
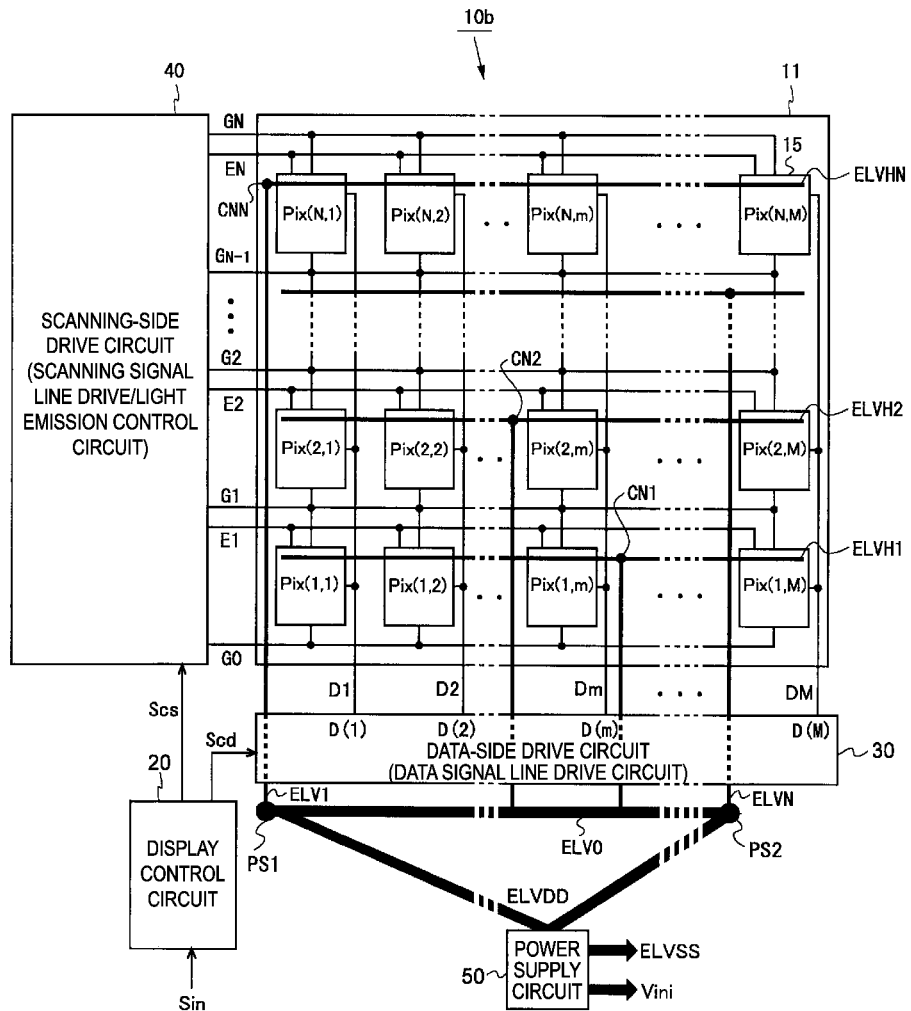
FIG. 4 is a block diagram illustrating an overall configuration of a display device according to a second configuration example of the first embodiment.

FIG. 4 is a block diagram illustrating an overall configuration of an organic EL display device 10b according to the second configuration example of the first embodiment. The display device 10b differs from the display device 10a according to the first configuration example (FIG. 1) in the configuration of power supply wiring lines, but is similar to the display device 10a according to the first configuration example in other points (see FIGS. 2 and 3). Hereinafter, in the display device 10b according to the present configuration example, the same or corresponding constituent elements as or to those in the display device 10a according to the first configuration example are denoted by the same reference signs, and detailed description thereof will be omitted.

In the first configuration example as illustrated in FIG. 1, the power supply point PS of the high-level power supply voltage ELVDD from the power supply circuit 50 to the main wiring line ELV0 is located at or near a position where the first trunk wiring line ELV1 branches off from the main wiring line ELV0, and a distance from the main wiring line ELV0 to the connection point CNi between the trunk wiring line and the branch wiring line is shorter in order from the first trunk wiring line ELV1 toward the M-th trunk wiring line ELVM. In other words, the connection point CNi between the trunk wiring line ELVk and the branch wiring line ELVHi is provided in such a manner that, as the trunk wiring line ELVk ($1 \leq k \leq M$) is closer to the power supply point PS, the trunk wiring line ELVk is connected to a farther branch wiring line ELVHi.

In contrast, in the present configuration example, as illustrated in FIG. 4, the high-level power supply voltage ELVDD is supplied from the power supply circuit 50 to both end portions of the main wiring line ELV0 in the power supply line. In other words, the high-level power supply voltage ELVDD is supplied from the power supply circuit 50 to two power supply points PS1 and PS2 in the main wiring line ELV0. Of the two power supply points, the first power supply point PS1 is located at or near a position where the first trunk wiring line ELV1 branches off from the main wiring line ELV0, and the second power supply point PS2 is located at or near a position where the N-th trunk wiring line ELVN (the trunk wiring line located at the end portion on the opposite side to the end portion where the first trunk wiring line is located) branches off from the main wiring line ELV0. In accordance with this, the distance from the main wiring line ELV0 to the connection point CNi between the trunk wiring line and the branch wiring line becomes shorter in order from the trunk wiring lines ELV1 and ELVM on both the ends toward the center in the row direction. The configuration of power supply lines in the present configuration example described above may be the same as the first configuration example in a point that the connection point CNi between the trunk wiring line ELVk and the branch wiring line ELVHi is provided in such a manner that, as the trunk wiring line ELVk is closer to the power supply point (PS1 or PS2), the trunk wiring line ELVk is connected to a farther branch wiring line ELVHi. In the present configuration example, as illustrated in FIG. 4, the number of trunk wiring lines is equal to the number N of branch wiring lines, and only one trunk wiring line ELVj is connected to each branch wiring line ELVHi. However, as in the first configuration example (FIG. 1), the number M of trunk wiring lines may be greater than the number N of branch wiring lines (M>N), and one or more of the trunk wiring lines ELVj may be connected to each branch wiring line ELVHi.

In this configuration example as well, only one branch wiring line ELVHi is connected to each trunk wiring line ELVk (k=1 to N), while assuming that one or more trunk wiring lines ELVj are connected to each branch wiring line ELVHi. As a result, the high-level power supply voltage ELVDD with substantially no voltage drop may be supplied from the corresponding branch wiring line to each pixel circuit 15 in the data write period thereof, so that the same effects as those of the first configuration example may be obtained. Accordingly, also in the present configuration example, it is possible to suppress the degradation in display quality due to a luminance gradient or the like caused by the voltage drop across the power supply line while avoiding the increase in size of the circuit and the like as much as possible.

1.4.2 Third Configuration Example

Figure 5:
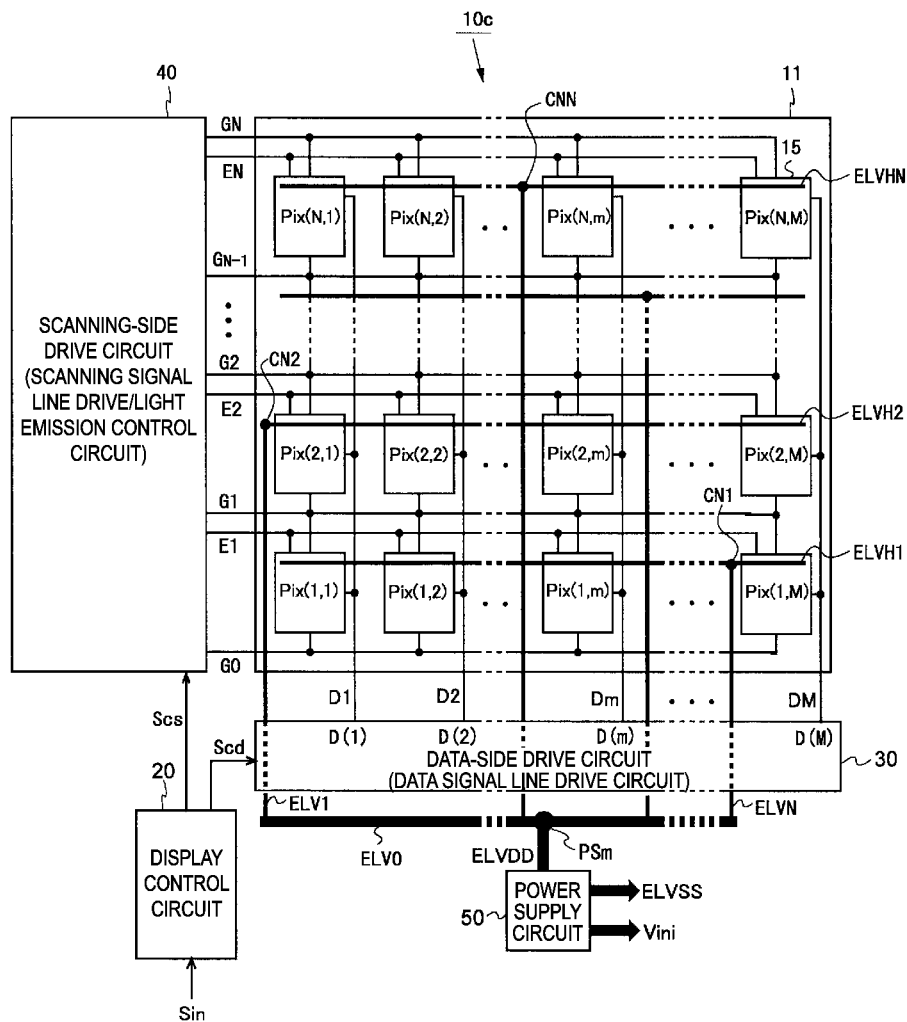
FIG. 5 is a block diagram illustrating an overall configuration of a display device according to a third configuration example of the first embodiment.

FIG. 5 is a block diagram illustrating an overall configuration of an organic EL display device 10c according to a third configuration example of the first embodiment. The display device 10c differs from the display device 10a according to the first configuration example (FIG. 1) in the configuration of power supply wiring lines, but is similar to the display device 10a according to the first configuration example in other points (see FIGS. 2 and 3). Hereinafter, in the display device 10c according to the present configuration example, the same or corresponding constituent elements as or to those in the display device 10a according to the first configuration example are denoted by the same reference signs, and detailed description thereof will be omitted.

In the present configuration example, as illustrated in FIG. 5, the high-level power supply voltage ELVDD is supplied from the power supply circuit 50 to a power supply point PSm at the center position of the main wiring line ELV0 in the power supply line. The power supply point PSm is located at or near a position where a central trunk wiring line ELVm among M trunk wiring lines ELV1 to ELVM (there may be two central trunk wiring lines in some cases) branches off from the main wiring line ELV0. In accordance with this, the distance from the main wiring line ELV0 to the connection point CNi between the trunk wiring line and the branch wiring line becomes shorter in order from the central trunk wiring line ELVm toward the trunk wiring lines on both end portions. The configuration of power supply lines in the present configuration example described above may be the same as the first configuration example in a point that the connection point CNi between the trunk wiring line and the branch wiring line is provided in such a manner that, as the trunk wiring line is closer to the power supply point (PSm), the trunk wiring line is connected to a farther branch wiring line. In the present configuration example as well, as illustrated in FIG. 5, at least one trunk wiring line ELVj is connected to each branch wiring line ELVHi.

In this configuration example as well, only one branch wiring line ELVHi is connected to each trunk wiring line ELVk (k=1 to N), while assuming that one trunk wiring line ELVj is connected to each branch wiring line ELVHi. As a result, the high-level power supply voltage ELVDD with substantially no voltage drop may be supplied from the corresponding branch wiring line to each pixel circuit 15 in the data write period thereof, so that the same effects as those of the first configuration example may be obtained. Accordingly, also in the present configuration example, it is possible to suppress the degradation in display quality due to a luminance gradient or the like caused by the voltage drop across the power supply line while avoiding the increase in size of the circuit and the like as much as possible.

1.4.3 Fourth Configuration Example

Figure 6:
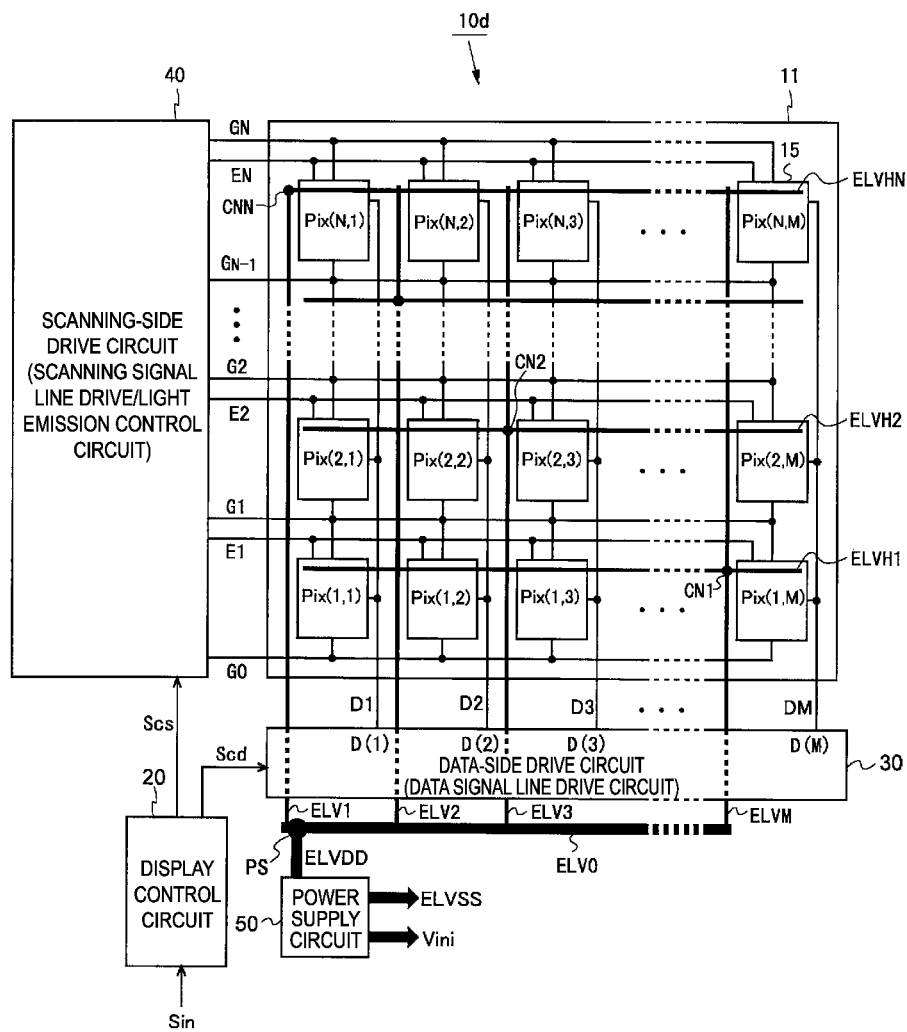
FIG. 6 is a block diagram illustrating an overall configuration of a display device according to a fourth configuration example of the first embodiment.

FIG. 6 is a block diagram illustrating an overall configuration of an organic EL display device 10d according to a fourth configuration example of the first embodiment. The display device 10d differs from the display device 10a according to the first configuration example (FIG. 1) in the configuration of power supply wiring lines, but is similar to the display device 10a according to the first configuration example in other points (see FIGS. 2 and 3). Hereinafter, in the display device 10d according to the present configuration example, the same or corresponding constituent elements as or to those in the display device 10a according to the first configuration example are denoted by the same reference signs, and detailed description thereof will be omitted.

In the present configuration example as illustrated in FIG. 6, similar to the first configuration example, the high-level power supply voltage ELVDD is supplied from the power supply circuit 50 to the power supply point PS located at one end portion of the main wiring line ELV0 in the power supply line. In other words, the power supply point PS in the present configuration example is located at or near a position where the first trunk wiring line ELV1 branches off from the main wiring line ELV0. In accordance with this, similar to the first configuration example, the distance from the main wiring line ELV0 to the connection point CNi between the trunk wiring line and the branch wiring line becomes shorter in order from the first trunk wiring line ELV1 toward the M-th trunk wiring line ELVM.

However, in the present configuration example, each of the trunk wiring lines ELV1 to ELVM extends in the column direction from the main wiring line ELV0 to the position of the N-th scanning signal line GN (the farthest scanning signal line from the main wiring line), intersects all of the scanning signal lines G1 to GN, and has the same length. In this regard, the present configuration example differs from the first configuration example in which each trunk wiring line ELVj extends in the column direction from the main wiring line ELV0 to the connection point CNi with the branch wiring line ELVHi and the length thereof becomes shorter in order from the first trunk wiring line ELV1 toward the M-th trunk wiring line ELVM (as the trunk wiring line ELVj is closer to the power supply point PS, the length thereof is longer) (see FIGS. 1 and 6).

In this configuration example as well, only one branch wiring line ELVHi is connected to each trunk wiring line ELVk (k=1 to M), while assuming that one or more trunk wiring lines ELVj are connected to each branch wiring line ELVHi. As a result, the high-level power supply voltage ELVDD with substantially no voltage drop may be supplied from the corresponding branch wiring line to each pixel circuit 15 in the data write period thereof, so that the same effects as those of the first configuration example may be obtained. Accordingly, also in the present configuration example, it is possible to suppress the degradation in display quality due to a luminance gradient or the like caused by the voltage drop across the power supply line while avoiding the increase in size of the circuit and the like as much as possible.

Furthermore, according to the present configuration example, since all of the trunk wiring lines ELV1 to ELVM have the same length, parasitic capacitance added to each of the scanning signal lines Gi due to the intersection of the scanning signal line Gi and the trunk wiring line ELVj has the same value for any of the scanning signal lines Gi. In other words, in the present configuration example, wiring line capacitance of the scanning signal lines G1 to GN is made to be uniform in comparison with the first configuration example, which makes it possible to suppress the degradation in display quality caused by an increase in the wiring line capacitance of the scanning signal lines due to the arrangement of the trunk wiring lines ELV1 to ELVM.

1.4.4 Suitable Configuration Examples of Power Supply Lines

Figure 7:
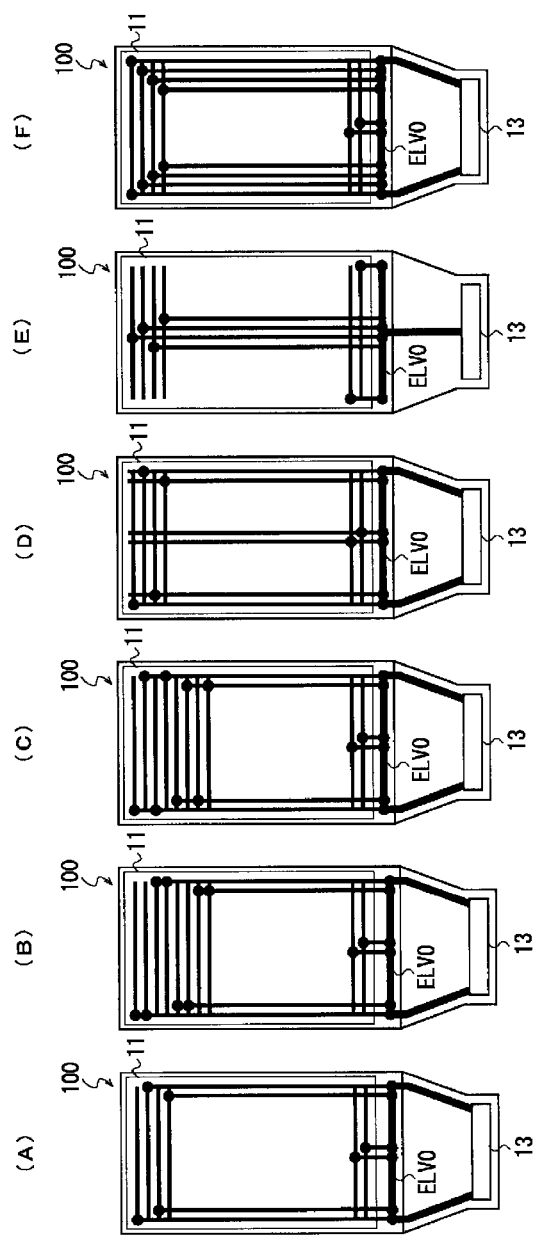
FIG. 7 includes diagrams (A to F) schematically illustrating several suitable configuration examples of power supply lines in the first embodiment.

Several suitable configurations of power supply lines in the present embodiment will be illustratively described below including the above-described configurations of the power supply lines regarding the display devices according to the present embodiment. FIG. 7 includes diagrams schematically illustrating several suitable configuration examples of power supply lines in the present embodiment.

FIG. 7(A) schematically illustrates the configuration of the power supply lines in the display device 10b according to the second configuration example illustrated in FIG. 4, and more specifically, illustrates schematically the configuration of the high-level power supply lines in a display panel (including the display portion 11) 100 inside the display device 10b. The display panel 100 includes a terminal portion 13 in addition to the display portion 11, and the high-level power supply voltage ELVDD is supplied from the power supply circuit 50 via the terminal portion 13 to the main wiring line ELV0 (this point is the same as that in other configuration examples illustrated in FIGS. 7(B) to 7(F). In the example of FIG. 7(A), the high-level power supply voltage ELVDD is supplied via the terminal portion 13 to both ends (to the power supply points PS1 and PS2 located on both the ends) of the main wiring line ELV0. In the display portion 11, each of the branch wiring lines (power supply lines extending in the row direction) is connected to any one of the trunk wiring lines (power supply lines extending in the column direction), and each of the trunk wiring lines is connected to any one of the branch wiring lines. As a result, in the data write period of the pixel circuits in each row, no current flows in not only the branch wiring line connected to the pixel circuits in the row but also in the trunk wiring line connected to the branch wiring line, so that no voltage drop is generated. In addition, the distance from the main wiring line ELV0 to the connection point CNi between the trunk wiring line and the branch wiring line becomes shorter in order from the trunk wiring lines on both the ends toward the center in the row direction. This suppresses a difference in path length between the pixel circuits of the power supply lines from the power supply circuit 50 to each of the pixel circuits. Note that because each of the trunk wiring lines branches off from the main wiring line ELV0 and extends to the connection point with the branch wiring line, each of the trunk wiring lines becomes shorter in length in order from the trunk wiring lines on both the ends toward the center in the row direction.

The configuration example of the power supply lines illustrated in FIG. 7(B) is basically the same as the configuration example of the power supply lines illustrated in FIG. 7(A). However, each of the trunk wiring lines (power supply lines extending in the column direction) is connected to two branch wiring lines (power supply lines extending in the row direction) adjacent to each other, and in this regard, the present configuration example differs from the configuration example of the power supply lines illustrated in FIG. 7(A). However, instead of a driving method illustrated in FIG. 3, by adopting a driving method for controlling light emission while taking, as a unit, the pixel circuits in two rows corresponding to two branch wiring lines connected to each trunk wiring line, that is, by adopting a driving method in which, after the completion of the initialization operation and data write operation of the pixel circuits in the two rows, the light emission control line corresponding to the pixel circuits in the two rows is set to the low level (active state), the same effect as that of the configuration example of FIG. 7(A) is obtained. In other words, also in the data write period of the pixel circuit in any row of the above-described two rows, since no current flows through the two branch wiring lines corresponding to the pixel circuits in the two rows, no current flows through the trunk wiring line connected to the two branch wiring lines, so that no voltage drop is generated. In the present configuration example as well, similar to the configuration example of FIG. 7(A), the distance from the main wiring line ELV0 to the connection point CNi between the trunk wiring line and the branch wiring line becomes shorter in order from the trunk wiring lines on both ends toward the center in the row direction, thereby suppressing the difference in path length between the pixel circuits of the power supply lines from the power supply circuit 50 to each of the pixel circuits. Note that when the driving method described in FIG. 3 is employed in the present configuration example, in the data write period of the pixel circuits in each row, there is a case in which a current to be supplied to another branch wiring line flows through the trunk wiring line connected to the branch wiring line corresponding to the pixel circuits in the above-described row. However, even in this case, the current is a current supplied to one branch wiring line, so that a voltage drop due to the current is small.

The configuration example of the power supply lines illustrated in FIG. 7(C) is basically the same as the configuration example of the power supply lines illustrated in FIG. 7(B). However, each of the trunk wiring lines (power supply lines extending in the column direction) is connected to two branch wiring lines (power supply lines extending in the row direction) adjacent to each other every other line, and in this regard, the present configuration example differs from the configuration example of the power supply lines illustrated in FIG. 7(B). However, in the present configuration example as well, instead of the driving method illustrated in FIG. 3, by adopting a driving method suitable for the present configuration example, for example, a driving method for controlling light emission while taking, as a unit, the pixel circuits in two rows corresponding to two branch wiring lines adjacent to each other every other line and connected to each trunk wiring line, the same effect as that of the configuration example of FIG. 7(A) is obtained. In other words, also in the data write period of the pixel circuit in any row of the above-described two rows, since no current flows through the two branch wiring lines corresponding to the pixel circuits in the two rows, no current flows through the trunk wiring line connected to the two branch wiring lines, so that no voltage drop is generated. In the present configuration example as well, similar to the configuration examples of FIG. 7(A) and FIG. 7(B), the distance from the main wiring line ELV0 to the connection point CNi between the trunk wiring line and the branch wiring line becomes shorter in order from the trunk wiring lines on both ends toward the center in the row direction, thereby suppressing the difference in path length between the pixel circuits of the power supply lines from the power supply circuit 50 to each of the pixel circuits. Note that when the driving method described in FIG. 3 is employed in the present configuration example, in the data write period of the pixel circuits in each row, there is a case in which a current to be supplied to another branch wiring line flows through the trunk wiring line connected to the branch wiring line corresponding to the pixel circuits in the above-described row. However, even in this case, the current is a current supplied to one branch wiring line, so that a voltage drop due to the current is small.

The configuration example of the power supply lines illustrated in FIG. 7(D) is the same as the configuration example of the power supply lines illustrated in FIG. 7(A) in the arrangement of the connection points between the trunk wiring lines and the branch wiring lines. However, all of the trunk wiring lines extend in the column direction to intersect with any of the scanning signal lines (and intersects with any of the branch wiring lines), and have the same length. Because of this, parasitic capacitance added to each scanning signal line due to the intersection between the scanning signal line and the trunk wiring line has the same value for any of the scanning signal lines. In other words, in the present configuration example, wiring line capacitance of each scanning signal line is made to be uniform compared to the configuration example of FIG. 7(A). In the present configuration example as well, similar to the configuration example of FIG. 7(A), in the data write period of the pixel circuits in each row, no current flows in not only the branch wiring line connected to the pixel circuits in the row but also in the trunk wiring line connected to the branch wiring line, so that no voltage drop is generated.

FIG. 7(E) schematically illustrates the configuration of the power supply lines (high-level power supply lines) in the display panel (including the display portion 11) inside the display device 10c according to the third configuration example illustrated in FIG. 5. In the example of FIG. 7(E), the high-level power supply voltage ELVDD is supplied via the terminal portion 13 to the center of the main wiring line ELV0. In the display portion 11, each of the branch wiring lines (power supply lines extending in the row direction) is connected to any one of the trunk wiring lines (power supply lines extending in the column direction), and each of the trunk wiring lines is connected to any one of the branch wiring lines. As a result, in the data write period of the pixel circuits in each row, no current flows in not only the branch wiring line connected to the pixel circuits in the row but also in the trunk wiring line connected to the branch wiring line, so that no voltage drop is generated. In addition, the distance from the main wiring line ELV0 to the connection point CNi between the trunk wiring line and the branch wiring line becomes longer in order from the trunk wiring lines on both ends toward the center in the row direction. This suppresses a difference in path length between the pixel circuits of the power supply lines from the power supply circuit 50 to each of the pixel circuits. Note that because each of the trunk wiring lines branches off from the main wiring line ELV0 and extends to the connection point with the branch wiring line, each of the trunk wiring lines becomes longer in length in order from the trunk wiring lines on both the ends toward the center in the row direction.

FIG. 7(F) illustrates a configuration example in which the number M of trunk wiring lines is greater than the number N of branch wiring lines. In the present configuration example, similar to the configuration example illustrated in FIG. 7(A), the high-level power supply voltage ELVDD is supplied via the terminal portion 13 to both ends of the main wiring line ELV0. However, in the present configuration example, unlike the configuration example illustrated in FIG. 7(A), because the number M of trunk wiring lines is greater than the number N of branch wiring lines, the upper branch wiring lines (branch wiring lines located far from the main wiring line ELV0) are each connected to two trunk wiring lines arranged symmetrically about the trunk wiring line at the center, while the lower branch wiring lines (branch wiring lines located close to the main wiring line ELV0) are each connected to one trunk wiring line arranged near the center. In this manner, each branch wiring line is connected to one or two of the trunk wiring lines, and each trunk wiring line is connected to only one of the branch wiring lines. As a result, similar to the configuration example of FIG. 7(A), in the data write period of the pixel circuits in each row, no current flows in not only the branch wiring line connected to the pixel circuits in the row but also in the trunk wiring line connected to the branch wiring line, so that no voltage drop is generated. In addition, the distance from the main wiring line ELV0 to the connection point CNi between the trunk wiring line and the branch wiring line becomes shorter in order from the trunk wiring lines on both the ends toward the center in the row direction. This suppresses a difference in path length between the pixel circuits of the power supply lines from the power supply circuit 50 to each of the pixel circuits. Note that since the distance from the main wiring line ELV0 to the branch wiring line to which the trunk wiring line near the center needs to be connected is short, the voltage drop will not be problematic even when only one trunk wiring line is connected to the branch wiring line.

As may be understood from the above description, according to any of the configuration examples illustrated in FIGS. 7(A) to 7(F), by adopting the driving methods in accordance with the configuration examples, the following may be achieved: in the data write period of each pixel circuit, no current flows through the branch wiring line (corresponding branch wiring line) connected to the pixel circuit whereby no voltage drop is generated, and in addition, no current flows through the trunk wiring line connected to the branch wiring line whereby no voltage drop is generated. As described earlier, a path, among the power supply lines, that extends from the main wiring line ELV0 and the power supply circuit 50 to reach the main wiring line ELV0 via the terminal portion 13 may be formed as a wiring line with sufficiently low wiring line resistance from the perspective of the arrangement space compared to the branch wiring lines and the trunk wiring lines disposed in the display portion 11. With this, it is possible to supply the high-level power supply voltage ELVDD with substantially no voltage drop from the corresponding branch wiring line to each of the pixel circuits in the data write period thereof. Accordingly, it is possible to suppress the degradation in display quality due to a luminance gradient or the like caused by the voltage drop across the power supply line while avoiding the increase in size of the circuit and the like as much as possible. Further, in any of the configuration examples illustrated in FIGS. 7(A) to 7(F), the connection points between the trunk wiring lines and the branch wiring lines are provided in such a manner that as the trunk wiring line closer to the power supply point where the high-level power supply voltage ELVDD is supplied to the main wiring line ELV0 via the terminal portion 13 from the power supply circuit 50, the trunk wiring line is connected to a farther branch wiring line. This suppresses a difference in path length between the pixel circuits of the power supply lines from the power supply circuit 50 to each of the pixel circuits, whereby the degradation in display quality due to the luminance gradient or the like is further suppressed. Furthermore, according to the configuration example illustrated in FIG. 7(D), wiring line capacitance of the scanning signal lines is made to be uniform in comparison with other configuration examples, which makes it possible to suppress the degradation in display quality caused by an increase in the wiring line capacitance of the scanning signal lines due to the arrangement of the trunk wiring lines.

1.5 Layout Pattern

In the following, a layout pattern for implementing the pixel circuit 15 (FIG. 2) in the present embodiment (hereinafter referred to as a "layout pattern of pixel circuits") and a layout pattern for implementing a circuit to be formed in the display portion 11, that is, a circuit including the pixel circuits arranged in a matrix shape, power supply lines, and the like (hereinafter referred to as a "layout pattern of the display portion") will be described.

1.5.1 First Example of Layout Pattern

Figure 8:
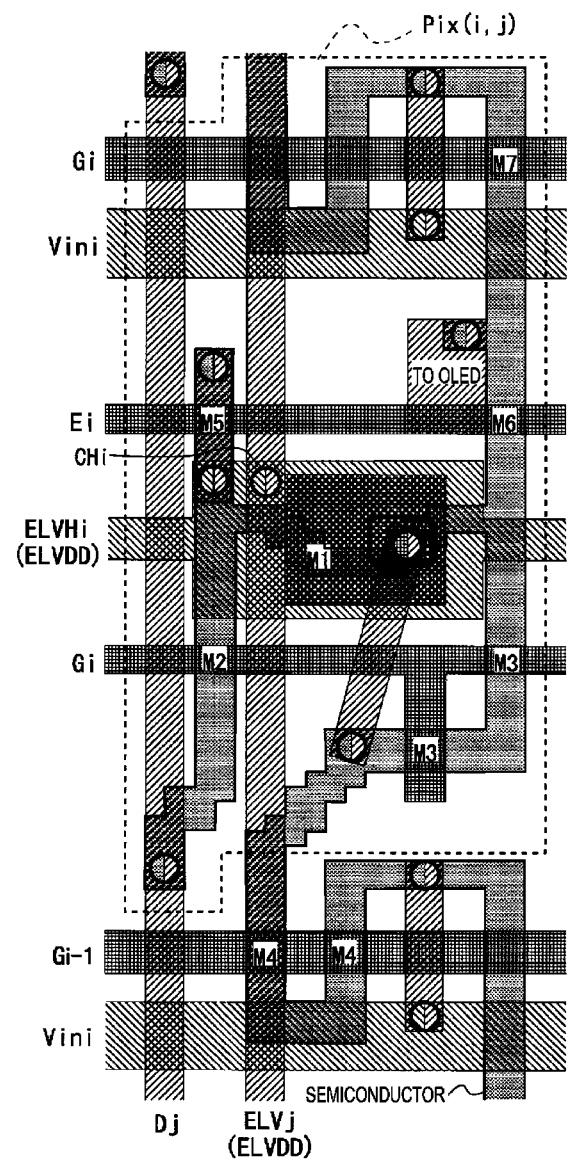
FIG. 8 is a diagram illustrating a first example of a layout pattern of a pixel circuit in the first embodiment.

FIG. 8 is a diagram illustrating a first example of a layout pattern of a pixel circuit Pix(i, j) in the i-th row and the j-th column according to the present embodiment (see FIG. 2). In FIG. 8, a pattern hatched with oblique lines and extending in the column direction (vertical direction in the drawing) indicates a wiring line pattern that is formed with a metal material in a certain layer, a pattern hatched with oblique lines and extending in the row direction (right and left direction in the drawing) indicates a wiring line pattern that is formed with a metal material in another layer, a pattern hatched with latticed lines and extending in the row direction indicates a wiring line pattern that is formed with a metal material in further another layer (a wiring line pattern of a gate line as a scanning signal line), and a pattern hatched with dots indicates a wiring line pattern that is formed with a semiconductor material in still another layer (see FIGS. 10 and 11 described below). A circle constituted of two differently hatched semicircles indicates a contact hole, and pieces of hatching drawn in the two semicircles indicate that a wiring line pattern represented by the hatching of one semicircle and a wiring line pattern represented by the hatching of the other semicircle are electrically connected conductively to each other by the contact hole.

Figure 9:
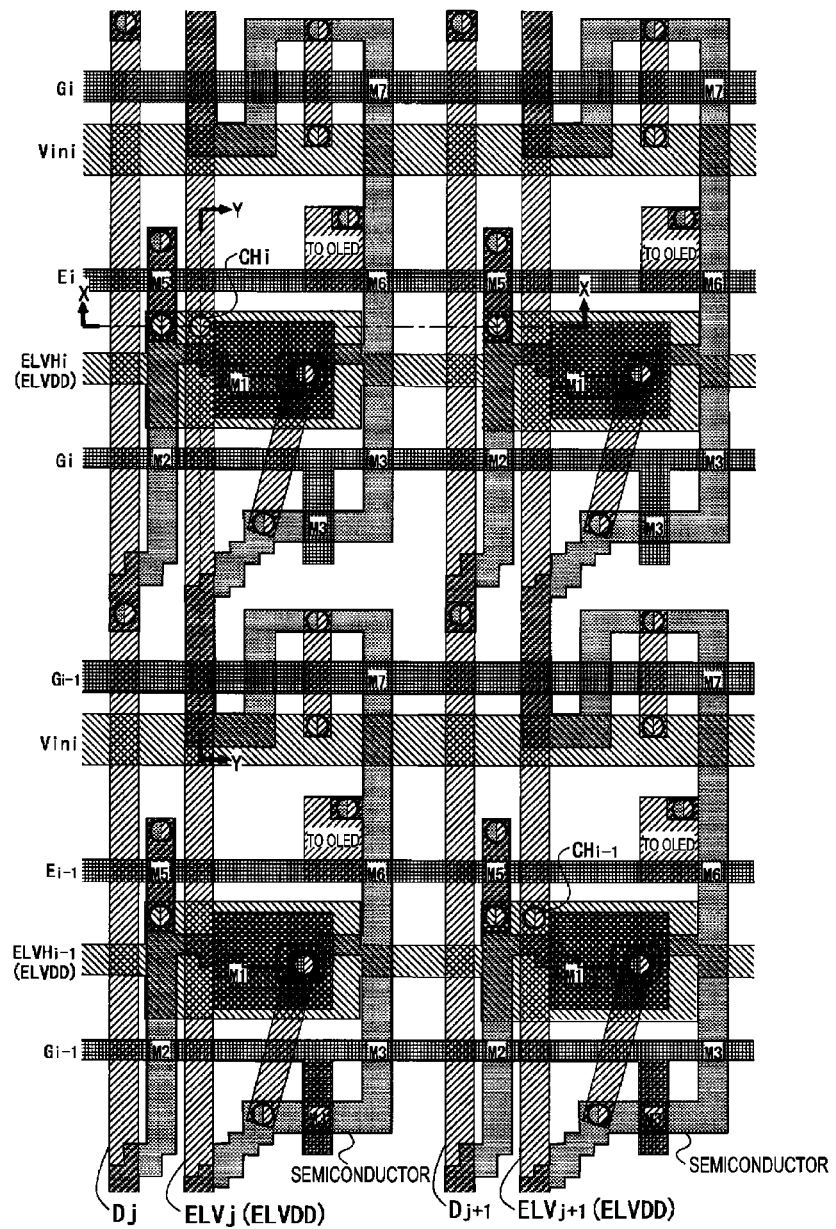
FIG. 9 is a diagram for describing a first example of a layout pattern of a display portion in the first embodiment.

FIG. 9 is a diagram illustrating a first example of a layout pattern of a display portion using the layout pattern of the pixel circuit Pix(i, j) illustrated in FIG. 8. The layout pattern of the display portion corresponds to the configuration of the power supply lines illustrated in FIG. 1, where M trunk wiring lines ELV1 to ELVM are disposed along M data signal lines D1 to DM, respectively, and only one branch wiring line ELVHi is connected to each trunk wiring line ELVj. However, since the number M of trunk wiring lines ELV1 to ELVM (M is equal to the number of data signal lines) is greater than the number N of branch wiring lines ELVH1 to ELVHN (N is equal to the number of scanning signal lines G1 to GN and the number of light emission control lines E1 to EN) (M>N), there is a portion (not illustrated) where two or more of the trunk wiring lines ELVj1, ELVj2, and the like are connected to one branch wiring line ELVHi.

Figure 10:
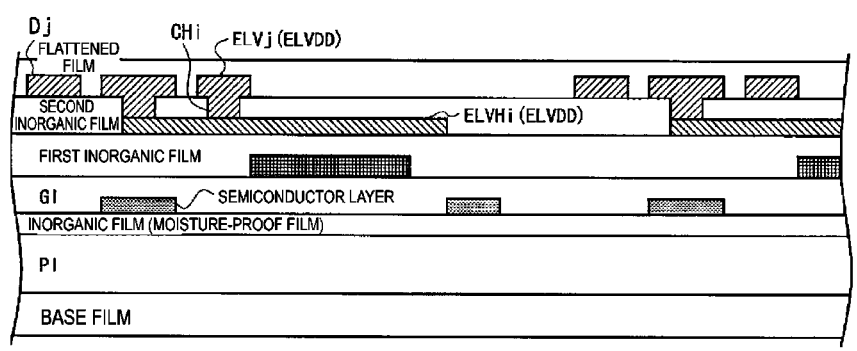
FIG. 10 is a cross-sectional view taken along a line X-X in FIG. 9.
Figure 11:
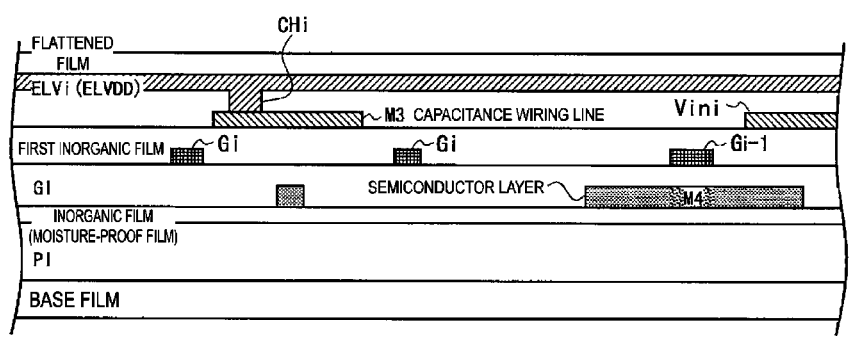
FIG. 11 is a cross-sectional view taken along a line Y-Y in FIG. 9.

FIG. 10 is a cross-sectional view taken along a line X-X in FIG. 9, and FIG. 11 is a cross-sectional view taken along a line Y-Y in FIG. 9. As understood from FIGS. 10 and 11, the trunk wiring line ELVj and the branch wiring line ELVHi are formed in mutually different wiring line layers with an insulating layer interposed therebetween, and the connection (electrical conduction connection) between the trunk wiring line ELVj and the branch wiring line ELVHi is achieved by a contact hole CHi provided in the above-described insulating layer. That is, the connection point CNi between the trunk wiring line ELVj and the branch wiring line ELVHi illustrated in FIGS. 1 and 2 is achieved by the contact hole CHi illustrated in FIGS. 8 to 11.

As described above, the circuit of the display portion 11 including the power supply lines (trunk and branch wiring lines) configured as illustrated in FIG. 1 may be implemented as a device having a structure as illustrated in FIGS. 8 to 11. As is apparent from FIGS. 8 to 11 (in particular, the cross-sectional views illustrated in FIGS. 10 and 11), the circuit of the display portion 11 including the power supply lines of other configurations illustrated in FIGS. 4 to 7 may also be implemented as a device having a similar structure.

1.5.2 Second Example of Layout Pattern

Figure 12:
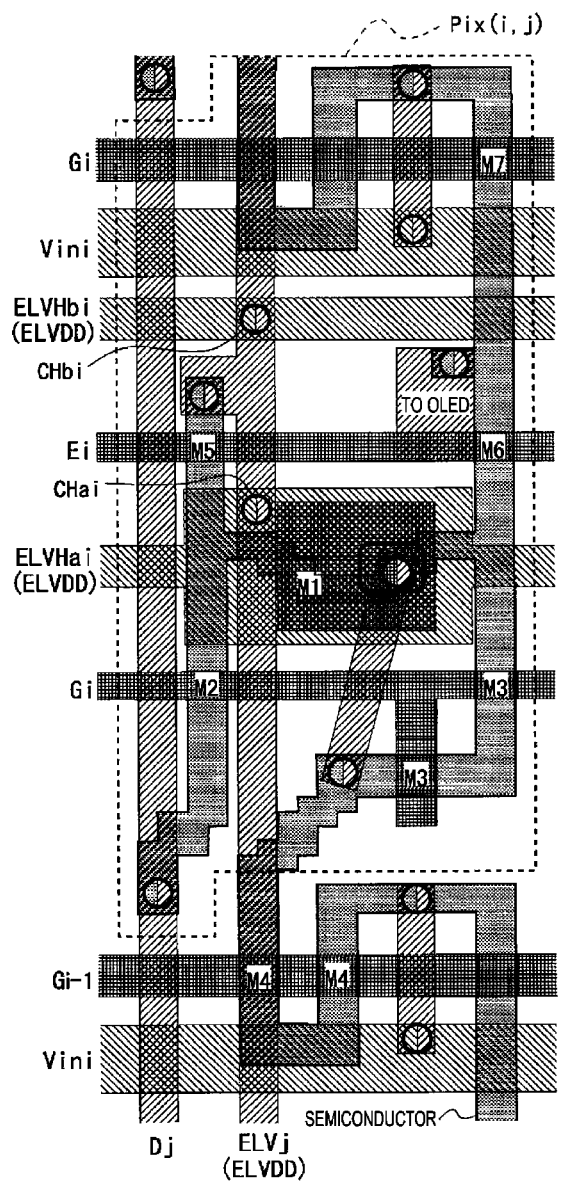
FIG. 12 is a diagram illustrating a second example of a layout pattern of a pixel circuit in the first embodiment.
Figure 13:
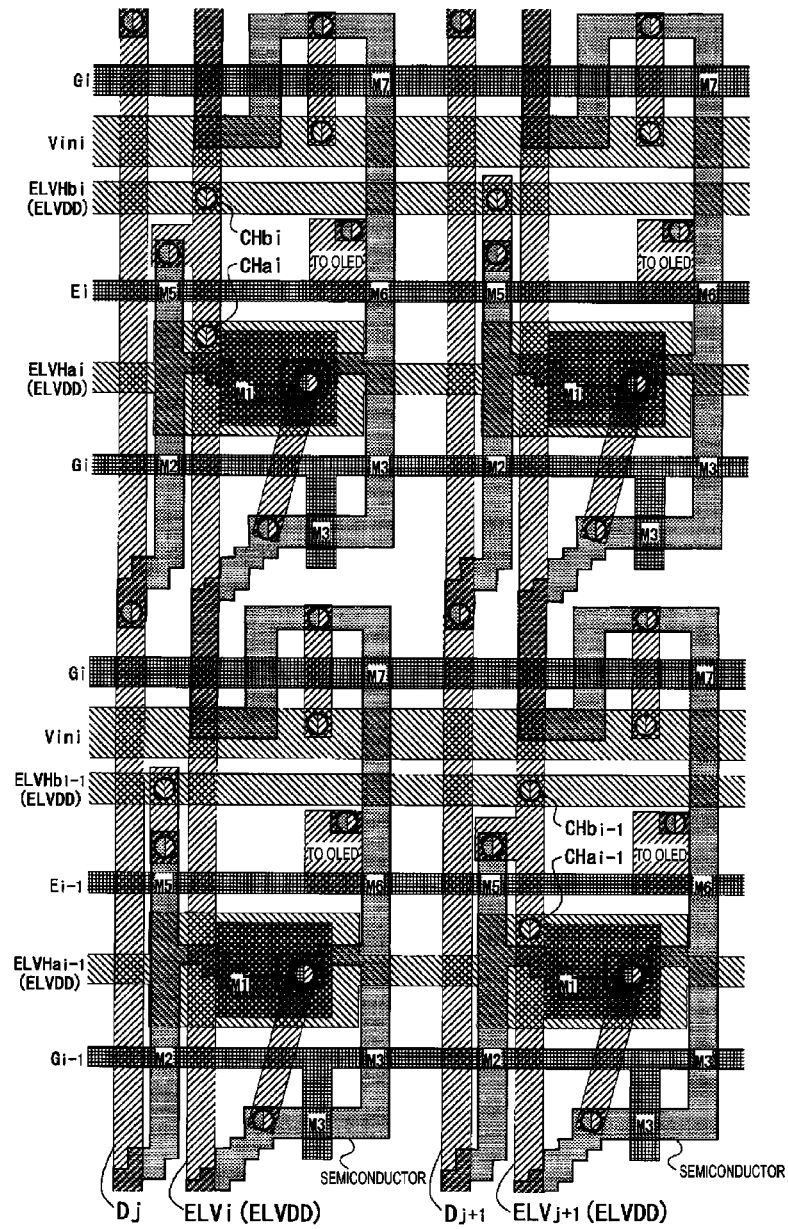
FIG. 13 is a diagram for describing a second example of a layout pattern of a display portion in the first embodiment.

FIG. 12 is a diagram illustrating a second example of the layout pattern of the pixel circuit Pix(i, j) in the i-th row and the j-th column in the present embodiment (see FIG. 2), and FIG. 13 is a diagram illustrating a second example of the layout pattern of the display portion using the layout pattern of the pixel circuit Pix(i, j) illustrated in FIG. 12. The layout pattern of the display portion also corresponds to the configuration of the power supply lines illustrated in FIG. 1.

In the layout pattern of the display portion illustrated in FIG. 13, one branch wiring line ELVHi in the configuration illustrated in FIG. 1 is achieved by two wiring line patterns ELVHai and ELVHbi, and in accordance with this, the connection point CNi between the trunk wiring line ELVj and the branch wiring line ELVHi is achieved by two contact holes CHai and CHbi. However, with the layout pattern according to the second example as described above, the circuit of the display portion 11 including the configuration of the power supply lines illustrated in FIG. 1 may also be achieved. As is apparent from FIGS. 12 and 13 and from FIGS. 10 and 11 described earlier, the circuit of the display portion 11 including the power supply lines of other configurations illustrated in FIGS. 4 to 7 may also be implemented by using a layout pattern similar to the layout pattern according to the second example.

2. Second Embodiment

In the first embodiment, the data signal lines D1 to DM in the display portion 11 are directly connected to the data-side drive circuit 30. However, instead of the above method, a driving method as follows (hereinafter referred to as a "source shared driving (SSD)" method) may be employed: a demultiplex circuit is provided between the data-side drive circuit and the data signal lines D1 to DM, and each data signal D(j) (j=1 to M) generated in the data-side drive circuit is demultiplexed and supplied to two or more of the data signal lines (source lines) in the display portion 11. An example of an organic EL display device employing the above-described SSD method will be described below as a second embodiment.

2.1 Configuration

Figure 14:
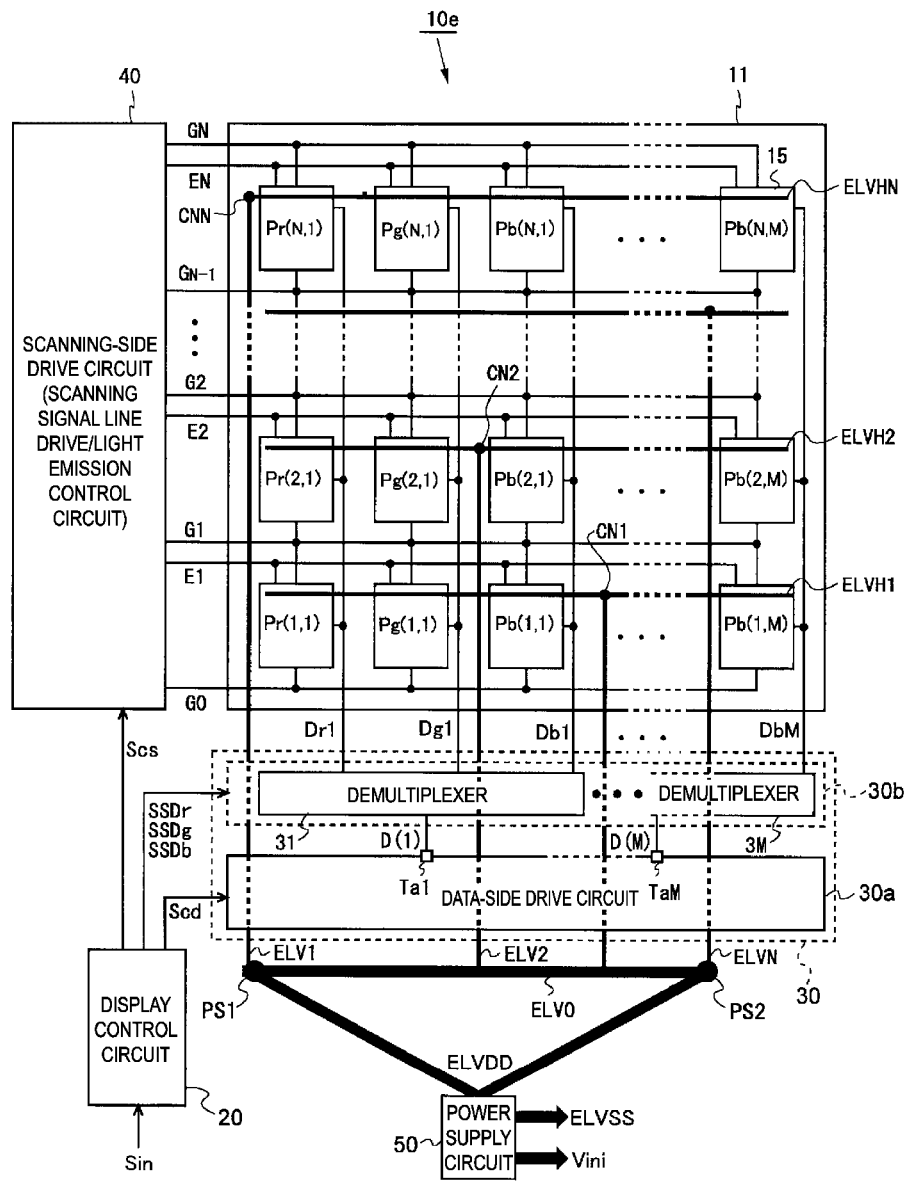
FIG. 14 is a block diagram illustrating an example of an overall configuration of a display device according to a second embodiment.

FIG. 14 is a block diagram illustrating an overall configuration of a display device 10e according to the present embodiment. The display device 10e is an organic EL display device that performs internal compensation similar to the first embodiment described above, but differs from the first embodiment in that the SSD method having multiplicity of three is employed. The display device 10e employs the SSD method for performing color display using three primary colors of red, green, and blue, in which three data signal lines corresponding to the three primary colors are used as a set and the three data signal lines of each set are driven in a time division manner. Constituent elements of the present embodiment other than the constituent elements described above are similar to those of the first embodiment, and therefore the same reference signs are denoted to the same or corresponding elements and detailed description thereof will be omitted.

As illustrated in FIG. 14, the display device 10e according to the present embodiment includes the display portion 11, the display control circuit 20, the data signal line drive circuit 30, the scanning-side drive circuit 40 configured to function as a scanning signal line drive and light emission control circuit, and the power supply circuit 50.

In the display portion 11, data signal lines Dr1, Dg1, Db1, ..., DrM, DgM, and DbM in M sets (3M in number) configuring, as one set, an R data signal line Drj, a G data signal line Dgj, and a B data signal line Dbj corresponding to red, green, and blue forming the three primary colors respectively, and N+1 scanning signal lines G0 to GN intersecting the data signal lines are disposed. In addition, similar to the first embodiment, N light emission control lines E1 to EN are disposed along N scanning signal lines G1 to GN, respectively.

As illustrated in FIG. 14, in the display portion 11, 3M×N pixel circuits 15 are arranged in a matrix shape along 3M data signal lines Dx1 to DxM (x=r, g, b) and N scanning signal lines G1 to GN, and each of the pixel circuits 15 corresponds to any one of the 3M data signal lines Dx1 to DxM (x=r, g, b) and to any one of the N scanning signal lines G1 to GN. When each of the pixel circuits 15 is distinguished in the following, a pixel circuit corresponding to an i-th scanning signal line Gi and a j-th R data signal line Drj set is referred to as an "R pixel circuit in an i-th row and a j-th set" and denoted by the reference sign "Pr(i, j)", a pixel circuit corresponding to the i-th scanning signal line Gi and a j-th G data signal line Dgj set is referred to as a "G pixel circuit in the i-th row and the j-th set" and denoted by the reference sign "Pg(i, j)", and a pixel circuit corresponding to the i-th scanning signal line Gi and a j-th B data signal line Dbj set is referred to as a "B pixel circuit in the i-th row and the j-th set" and denoted by the reference sign "Pb(i, j)". Note that each pixel circuit Px(i, j) also corresponds to any one of the N light emission control lines E1 to EN (x=r, g, b). Since the configuration of each pixel circuit 15 (Px(i, j)) in the present embodiment is similar to that of the pixel circuit 15 in the above-described first embodiment, the same constituent elements are denoted by the same reference signs and description thereof is omitted (see FIG. 2).

The 3M data signal lines Dx1 to DxM (x=r, g, b) are connected to a demultiplex circuit 30b described below within the data signal line drive circuit 30, and the N+1 scanning signal lines G0 to GN and the N light emission control lines E1 to EN are connected to the scanning-side drive circuit (scanning signal line drive/light emission control circuit) 40, similar to the first embodiment.

In the display portion 11, similar to the first embodiment described above, as power supply lines common to each of the pixel circuits 15, there are disposed a high-level power supply line for supplying a high-level power supply voltage ELVDD (denoted by the same reference sign ELVDD as that of the high-level power supply voltage), and a power supply line for supplying a low-level power supply voltage ELVSS (denoted by the same reference sign ELVSS as that of the low-level power supply voltage). The power supply lines in the present embodiment are configured similar to the second configuration example of the first embodiment described in FIG. 4. That is, as illustrated in FIG. 14, the high-level power supply line ELVDD includes one main wiring line ELV0 extending in a row direction, N trunk wiring lines ELV1 to ELVN branching off from the main wiring line ELV0 and extending in a column direction, and N branch wiring lines ELVH1 to ELVHN disposed along the scanning signal lines G1 to GN, respectively. The high-level power supply line ELVDD is configured such that one trunk wiring line ELVj is connected to each of the branch wiring lines ELVHi, and only one branch wiring line ELVHi is connected to each of the trunk wiring lines ELVj (i=1 to N, j=1 to N). Note that in the configuration illustrated in FIG. 14, the number of trunk wiring lines is equal to the number of branch wiring lines, but a larger number of trunk wiring lines (for example, 3×M trunk wiring lines) than the number of branch wiring lines may be provided. In this case, a configuration in which two or more trunk wiring lines are connected to one branch wiring line is included (see FIG. 7(F)).

In the configuration illustrated in FIG. 14, the high-level power supply voltage ELVDD is supplied from the power supply circuit 50 to power supply points PS1 and PS2 located on both ends of the main wiring line ELV0 in the power supply line. Of these power supply points PS1 and PS2, the first power supply point PS1 is located at or near a position where the first trunk wiring line ELV1 branches off from the main wiring line ELV0, and the second power supply point PS2 is located at or near a position where the N-th trunk wiring line ELVN branches off from the main wiring line ELV0. In accordance with this, a distance from the main wiring line ELV0 to a connection point CNi between the trunk wiring line and the branch wiring line becomes shorter in order from the trunk wiring lines ELV1 and ELVM on both the ends toward the center in the row direction. In other words, the connection point CNi between the trunk wiring line ELVj and the branch wiring line ELVHi is provided in such a manner that, as the trunk wiring line ELVk is closer to the power supply point (PS1 or PS2), the trunk wiring line ELVk is connected to a farther branch wiring line ELVHi.

Similar to the first embodiment, the display control circuit 20 receives an input signal Sin from outside of the display device 10e and, based on the input signal Sin, generates a data-side control signal Scd and a scanning-side control signal Scs, and outputs the data-side control signal Scd to a data-side drive circuit 30a within the data signal line drive circuit 30 and outputs the scanning-side control signal Scs to the scanning-side drive circuit 40. In addition, the display control circuit 20 outputs an R selection control signal SSDr, a G selection control signal SSDg, and a B selection control signal SSDb to the demultiplex circuit 30b within the data signal line drive circuit 30.

As illustrated in FIG. 14, the data signal line drive circuit 30 includes the data-side drive circuit 30a and the demultiplex circuit 30b. The data signal line drive circuit 30 functions as a driving signal generation circuit configured to generate data signals Dx(1) to Dx(M) for driving the data signal lines Dx1 to DxM (x=r, g, b).

The data-side drive circuit 30a has the same configuration as that of the data-side drive circuit 30 in the first embodiment, and includes M output terminals Ta1 to TaM. However, as described above, the SSD method having multiplicity of three is employed in the present embodiment, and thus the data-side drive circuit 30a functions as a time division data signal generation circuit. That is, the data-side drive circuit 30a outputs, in each of horizontal periods based on the data-side control signal Scd from the display control circuit 20, an R data signal Dr(j) to be applied to an R data signal line Drj, a G data signal Dg(j) to be applied to a G data signal line Dgj, and a B data signal db(j) to be applied to a B data signal line Dbj in a time division manner from the j-th output terminal Taj as a data signal D(j) (j=1 to M). More specifically, each horizontal period includes three periods including first to third periods, and the R data signal Dr(j) is output in the first period, the G data signal Dg(j) is output in the second period, and the B data signal db(j) is output in the third period. Note that in the i-th horizontal period, the R data signal Dr(j) includes pixel data to be written to an R pixel circuit Pr(i, j) in the i-th row and the j-th set, the G data signal Dg(j) includes pixel data to be written to a G pixel circuit Pg(i, j) in the i-th row and the j-the set, and the B data signal db(j) includes pixel data to be written to a B pixel circuit Pb(i, j) in the i-th row and the j-th set (i=1 to N, j=1 to M).

The demultiplex circuit 30b has M demultiplexers including first to M-th demultiplexers 31 to 3M. Each demultiplexer 3j (j=1 to M) has the same configuration, and demultiplexes the data signal D(j) output from the data-side drive circuit 30a. The R selection control signal SSDr, the G selection control signal SSDg, and the B selection control signal SSDb output from the display control circuit 20 are given to all of the demultiplexers 31 to 3M. The input side of the j-th demultiplexer 3j is connected to the j-th output terminal Taj in the data-side drive circuit 30a, and the output side thereof is connected to three data signal lines Drj, Dgj, and Dbj of the j-th set. Accordingly, each demultiplexer 3j includes a terminal to which the data signal D(j) is input, that is, an input terminal (hereinafter referred to as an "input terminal TIj") connected to the output terminal Taj in the data-side drive circuit 30a, and a terminal connected to the data signal line Dxj (hereinafter referred to as an "output terminal TOxj") (x=r, g, b). The j-th demultiplexer 3j is configured in such a manner that three selection control signals SSDx (x=r, g, b), which are alternately made to be active, are received, and the output terminal TOxj is electrically connected to the input terminal TIj when the selection control signal SSDx is at the low level (active) or the output terminal TOxj is electrically separated from the input terminal TIj and set to be in a high impedance state when the selection control signal SSDx is at the high level (non-active).

2.2 Layout Configuration

Figure 15:
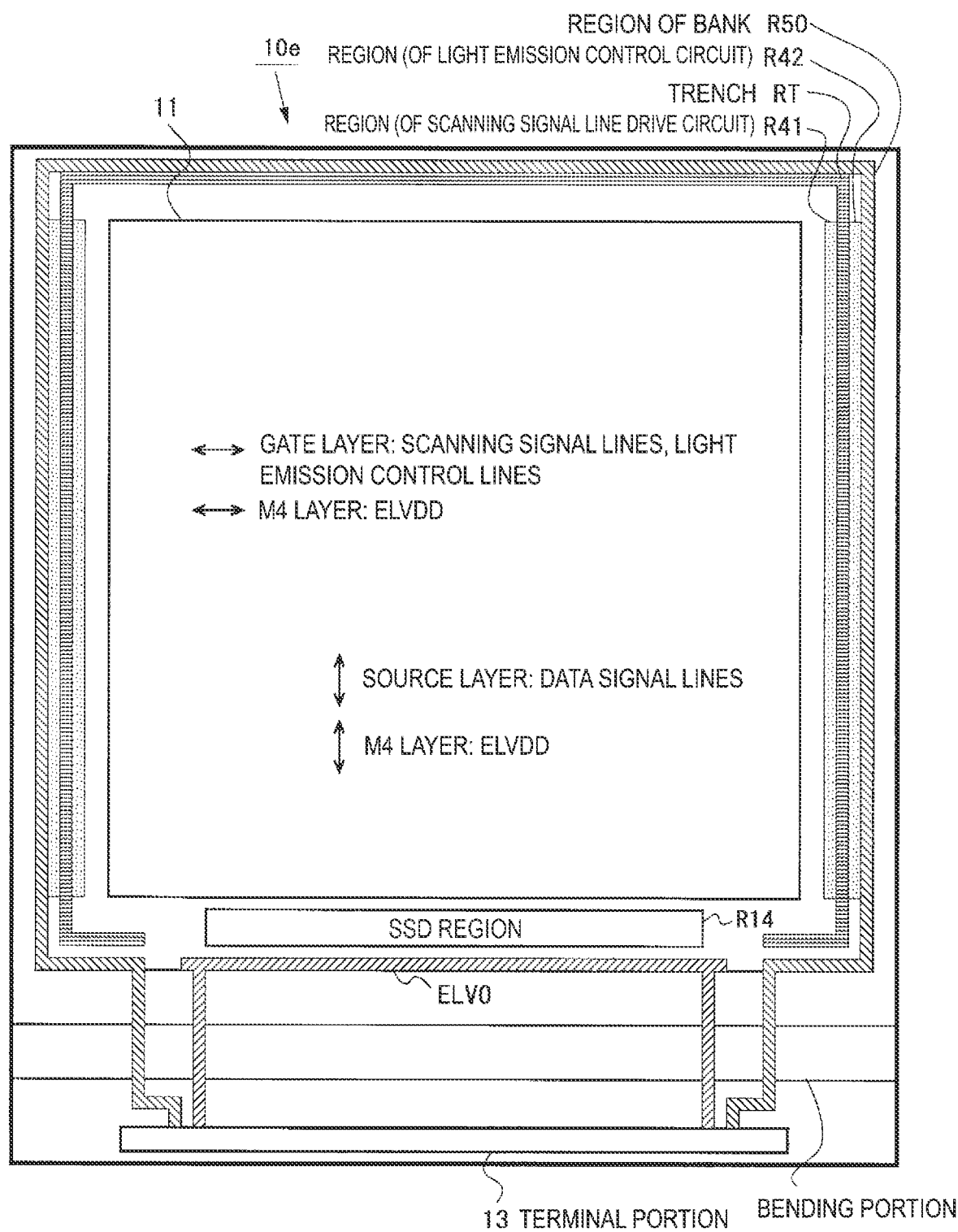
FIG. 15 is a diagram illustrating a layout configuration of a display device according to the second embodiment.

FIG. 15 is a diagram for describing a layout configuration of the present embodiment employing the SSD method. In the present embodiment as well, the display panel includes the display portion 11 in which the pixel circuits are arranged in a matrix shape and a terminal portion 13 for receiving a signal from the outside, the power supply voltage, and the like; in addition to these, the display panel includes an SSD region R14 on the periphery of the display portion along a side that is closest to the terminal portion 13 among the sides of the display portion 11. The demultiplex circuit 30b is integrally formed in the SSD region R14 in the same process as the pixel circuits and the like in the display portion 11. The main wiring line ELV0 in the power supply line is formed along the SSD region R14 between the SSD region R14 and the terminal portion 13, and the high-level power supply voltage ELVDD is supplied to the main wiring line from the outside power supply circuit 50 via the terminal portion 13. In the example illustrated in FIG. 15, the high-level power supply voltage ELVDD is supplied to both ends of the main wiring line ELV0.

A regions R41 for the scanning signal line drive circuit is provided on the periphery of the display portion 11 along two opposing sides, among the sides of the display portion 11, other than the side along the SSD region R14 and the side opposing the side along the SSD region R14, and on the outer side of the region R41, a trench RT is formed to surround the three sides of the display portion 11 in contact with the region R41. A region R42 for the light emission control circuit is provided on the outer side of the trench RT while being in contact with the trench RT and along the region R41. Furthermore, a bank region R50 for the control circuit is provided on the outer side of the region R42 in contact with the region R42 so as to surround the three sides of the display portion 11, and the bank region R50 includes a region for connecting to the terminal portion 13.

In the layout configuration illustrated in FIG. 15, the high-level power supply voltage ELVDD is supplied from the outside power supply circuit 50 to the main wiring line ELV0 via the terminal portion 13, and as illustrated in FIG. 14, the high-level power supply voltage ELVDD is supplied to each of the pixel circuits via each of the trunk wiring lines ELVj branching off from the main wiring line ELV0 and the branch wiring line ELVHi connected to each of the trunk wiring lines ELVj in the manner described above (not illustrated in FIG. 15).

2.3 Driving Method

Hereinafter, a driving method for the display device 10b according to the present embodiment will be described with reference to FIGS. 2 and 16, while focusing on three pixel circuits Pr(i, j), Pg(i, j), and Pb(i, j) in the i-th row and the j-th set.

Figure 16:
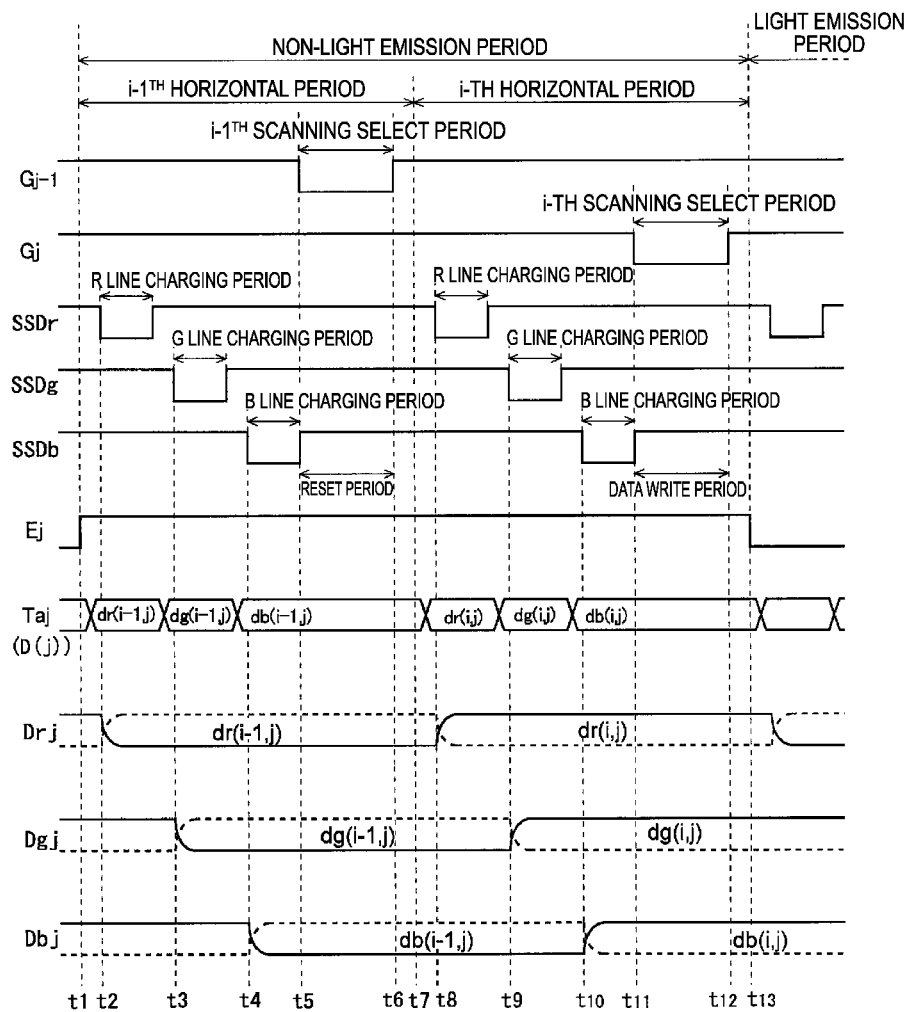
FIG. 16 is a signal waveform diagram for describing the drive of a display device according to the second embodiment.

FIG. 16 is a signal waveform diagram for describing the drive of the display device 10e according to the present embodiment, and illustrates changes of the signals in initialization and pixel data writing at the three pixel circuits Pr(i, j), Pg(i, j), and Pb(i, j) in the i-th row and the j-th set. In FIG. 16, a period from time t1 to time t13 represents a non-light emission period of the pixel circuits Pix(i, 1) to Pix(i, M) in the i-th row (x=r, g, b). A period from the time t1 to time t7 represents an $i-1^{th}$ horizontal period, and a period from the time t5 to time t6 represents a select period of an $i-1^{th}$ scanning signal line Gi-1, in other words, an $i-1^{th}$ scanning select period. The scanning select period (t5 to t6) corresponds to a reset period of the pixel circuits Px(i, 1) to Px(i, M) in the i-th row (x=r, g, b), and corresponds to a data write period of the pixel circuits Px(i-1, 1) to Px(i-1, M) in an $i-1^{th}$ row (x=r, g, b). A period from the time t7 to time t13 is the i-th horizontal period, and a period from the time t11 to time t12 is a select period of the i-th scanning signal line Gi, in other words, the i-th scanning select period. This scanning select period (t11 to t12) corresponds to a data write period of the pixel circuits Px(i, 1) to Px(i, M) in the i-th row (x=r, g, b), and also corresponds to a reset period of the pixel circuits Px(i+1, 1) to Px(i+1, M) in an $i-1^{th}$ row (x=r, g, b).

In the present embodiment, as illustrated in FIG. 16, in each horizontal period, the R selection control signal SSDr, the G selection control signal SSDg, and the B selection control signal SSDb are set at a low level (active) in sequence for a predetermined period in a period before the start time of the scanning select period (hereinafter referred to as a "period prior to selection"), whereby the output terminal electrically connected to the input terminal TIj is switched in sequence among the three output terminals TOrj, TOgj, and TObj in each demultiplexer 3j (j=1 to M).

Meanwhile, in the period prior to selection (t1 to t5) in the $i-1^{th}$ horizontal period, from the output terminal Taj of the data-side drive circuit 30a, an R data signal dr(i-1, j), a G data signal dg(i-1, j), and a B data signal db(i-1, j) are sequentially output in response to the R selection control signal SSDr, the G selection control signal SSDg, and the B selection control signal SSDb, as illustrated in FIG. 16. The voltages of the sequentially output R data signals dr(i-1, j), G data signal dg(i−1, j), and B data signal db(i−1, j) are supplied to the data signal lines Drj, Dgj, and Dbj, respectively, by the demultiplexer 3j, and are held in the wiring line capacitance of the data signal lines Drj, Dgj, and Dbj, respectively (hereinafter, the wiring line capacitance formed in each data signal line Dxj (x=r, g, b) is referred to as "data line capacitance Cdxj"). In other words, in the period prior to selection (t1 to t5), data line capacitance Cdrj, which is the wiring line capacitance of the R data signal line Drj, is charged by the voltage of the R data signal dr(i−1, j) during a period when the R selection control signal SSDr is at the low level (hereinafter, referred to as an "R line charging period"), data line capacitance Cdgj, which is the wiring line capacitance of the G data signal line Dgj, is charged by the voltage of the G data signal dg(i−1, j) during a period when the G selection control signal SSDg is at the low level (hereinafter referred to as a "G line charging period"), and data line capacitance Cdbj, which is the wiring line capacitance of the B data signal line Dbj, is charged by the voltage of the B data signal db(i−1, j) during a period when the B selection control signal SSDb is at the low level (hereinafter referred to as a "B line charging period"). As illustrated in FIG. 16, the voltage of the R data signal line Drj at the end of the R line charging period, the voltage of the G data signal line Dgj at the end of the G line charging period, and the voltage of the B data signal line Dbj at the end of the B line charging period are held at least during the scanning select period (t5 to t6) in the current horizontal period.

Thereafter, at the start time of the scanning select period (t5 to t6), the voltage of the scanning signal line Gi−1 changes to the low level (active), and during this scanning select period (t5 to t6), the voltage thereof is maintained at the low level. However, in each pixel circuit Px(i, j) in the i-th row and the j-th set (x=r, g, b), the voltage of the corresponding scanning signal line Gi is at the high level (non-active), so that the write control transistor M2 connected to the data signal line Dxj (x=r, g, b) is maintained in an off state. On the other hand, the first initialization transistor M4 in each pixel circuit Px (i, j) in the i-th row and the j-th set (x=r, g, b) is in an on state during the scanning select period (t5 to t6) (see FIG. 2). Thus, the voltage Vg of the gate terminal of the drive transistor M1 is initialized to the initialization voltage Vini.

In a period prior to selection (t7 to t11) as well in the i-th horizontal period (t7 to t13), which is a subsequent horizontal period, the R selection control signal SSDr, the G selection control signal SSDg, and the B selection control signal SSDb are set at the low level (active) in sequence for a predetermined period of time, whereby the output terminal electrically connected to the input terminal TIj is switched in sequence among the three output terminals TOrj, TOgj, and TObj in each demultiplexer 3j (j=1 to M).

In the period prior to selection (t7 to t11) in the i-th horizontal period, from the output terminal Taj of the data-side drive circuit 30a, an R data signal dr(i, j), a G data signal dg(i, j), and a B data signal db(i, j) are sequentially output in response to the R selection control signal SSDr, the G selection control signal SSDg, and the B selection control signal SSDb, as illustrated in FIG. 16. The voltages of the sequentially output R data signals dr(i, j), G data signal dg(i, j), and B data signal db(i, j) are supplied to the data signal lines Drj, Dgj, and Dbj, respectively, by the demultiplexer 3j, and are held in the wiring line capacitance of the data signal lines Drj, Dgj, and Dbj, respectively. In other words, in the period prior to selection (t7 to t11), the data line capacitance Cdrj, which is the wiring line capacitance of the R data signal line Drj, is charged by the voltage of the R data signal dr(i, j) during the R line charging period, the data line capacitance Cdgj, which is the wiring line capacitance of the G data signal line Dgj, is charged by the voltage of the G data signal dg(i, j) during the G line charging period, and the data line capacitance Cdbj, which is the wiring line capacitance of the B data signal line Dbj, is charged by the voltage of the B data signal db(i, j) during the B line charging period. The voltage of the R data signal line Drj at the end of the R line charging period, the voltage of the G data signal line Dgj at the end of the G line charging period, and the voltage of the B data signal line Dbj at the end of the B line charging period are held at least during the scanning select period (t11 to t12) in the current horizontal period.

Thereafter, at the start time of the scanning select period (t11 to t12), the voltage of the scanning signal line Gi changes to the low level (active), and during this scanning select period (t11 to t12), the voltage thereof is maintained at the low level. Thus, during this scanning select period (t11 to t12), the write control transistor M2 and the threshold compensation transistor M3 in each pixel circuit Px(i, j) in the i-th row and the j-th set (x=r, g, b) are in the on state (see FIG. 2).

Thus, during this scanning select period (t11 to t12), the voltage of the R data signal line Drj, that is, the voltage of the R data signal dr(i, j) held in the data line capacitance Cdrj is written to the R pixel circuit Pr(i, j) in the i-th row and the j-th set as pixel data, the voltage of the G data signal line Dgj, that is, the voltage of the G data signal dg(i, j) held in the data line capacitance Cdgj is written to the G pixel circuit Pg(i, j) in the i-th row and the j-th set as pixel data, and the voltage of the B data signal line Dbj, that is, the voltage of the B data signal db(i, j) held in the data line capacitance Cdbj is written to the B pixel circuit Pb(i, j) in the i-th row and the j-th set as pixel data.

With the above-described drive as illustrated in FIG. 16, the gate terminal voltage Vg of the drive transistor M1 is initialized in the i−1$^{th}$ scanning select period (t5 to t6) corresponding to a reset period for each pixel circuit Px(i, j) in the i-th row and the j-th set (x=r, g, b), while in the i-th scanning select period (t11 to t12) corresponding to a data write period, the data voltage on which threshold compensation has been performed is written to the holding capacitor C1 (see FIG. 2). Specific operations of each pixel circuit Px(i, j) in the reset period and the data write period (x=r, g, b) are substantially the same as the operations of the pixel circuit Pix(i, j) in the i-th row and the j-th column in the reset period and the data write period in the first embodiment described above, and therefore description thereof will be omitted.

2.4 Effects

In the present embodiment in which the SSD method described above is employed, the same effects as in the first embodiment may also be obtained by providing the same configuration as that in the first embodiment for the power supply lines (FIG. 14). That is, in the power supply lines, each trunk wiring line ELVj is connected to only one branch wiring line ELVHi. As a result, in the data write period of the pixel circuits in each row, no current flows in not only the branch wiring line connected to the pixel circuits in the row but also in the trunk wiring line connected to the branch wiring line, so that no voltage drop is generated. Similar to the above-described first embodiment, the path, among the power supply lines, that extends from the main wiring line ELV0 and the power supply circuit 50 to reach the main wiring line ELV0 via the terminal portion 13 may be formed as a wiring line with sufficiently low wiring line resistance from the perspective of the arrangement space compared to the branch wiring lines and the trunk wiring lines disposed in the display portion 11. With this, it is possible to supply the high-level power supply voltage ELVDD with substantially no voltage drop from the corresponding branch wiring line to each of the pixel circuits in the data write period thereof. Accordingly, it is possible to suppress the degradation in display quality due to a luminance gradient or the like caused by the voltage drop across the power supply line while avoiding the increase in size of the circuit and the like as much as possible. Note that in the present embodiment, even when the power supply lines in other configurations as described in the first embodiment (see FIGS. 4 to 7) are provided instead of the configuration of the power supply lines illustrated in FIG. 14, the same effects as those of the first embodiment including the power supply lines of the other configurations may be obtained.

3. Modification Example

The disclosure is not limited to the embodiments described above, and various modifications may be made without departing from the scope of the disclosure.

For example, in the first and fourth configuration examples (FIGS. 1 and 6) according to the first embodiment, the number of trunk wiring lines is equal to the number M of data signal lines and is greater than the number N of branch wiring lines (M>N), and in the second and third configuration examples (FIGS. 4 and 5) in the first embodiment, the number of trunk wiring lines is equal to the number N of branch wiring lines. However, no such limitation is intended. In other words, in any of the first to fourth configuration examples, it is sufficient that the number of trunk wiring lines is greater than or equal to the number of branch wiring lines. In this manner, it is possible that at least one trunk wiring line is connected to each branch wiring line, and that only one branch wiring line is connected to each trunk wiring line. Note that, as illustrated in FIGS. 7(B) to 7(D), in the configuration in which two branch wiring lines are connected to each of the trunk wiring lines, it is sufficient that the number of trunk wiring lines is equal to or greater than half the number of branch wiring lines.

In the first and second embodiments, the power supply lines (high-level power supply lines) are configured so that each of the trunk wiring lines is connected to one or two branch wiring lines, but it is sufficient that each of the trunk wiring lines is connected to only part of N branch wiring lines in the display portion 11. Such a configuration is advantageous in that, in a write period of the data voltage with respect to each pixel circuit, the voltage drop across the trunk wiring line connected to the branch wiring line (the corresponding branch wiring line) connected to the pixel circuit is reduced compared to the related art, thereby suppressing the degradation in display quality due to the luminance gradient or the like caused by the voltage drop across the power supply line.

In the first and second embodiments described above, the main wiring line ELV0 in the power supply line is a single wiring line provided in the frame region on the periphery of the display portion 11 and extending in the row direction, but two or more power supply wiring lines extending in the row direction may be formed as the main wiring line ELV0 in the frame region. The main wiring line ELV0 is preferably formed of the same metal material in the same layer as the plurality of trunk wiring lines ELV1 to ELVM (or ELV1 to ELVN) branching off from the main wiring line ELV0.

In the above-described first and second embodiments, the pixel circuit corresponding to the internal compensation scheme as illustrated in FIG. 2 is used, but the configuration of the pixel circuit is not limited thereto. A pixel circuit in another configuration may be used as long as the pixel circuit is configured such that one end of the holding capacitor C1 is connected to the gate terminal of the drive transistor M1, and the other end of the holding capacitor C1 and the source terminal of the drive transistor M1 are connected to the corresponding branch wiring line ELVi, and a current does not flow through the organic EL element during the data write period.

In the second embodiment, the SSD method having multiplicity of three is employed as illustrated in FIG. 14, but the multiplicity of the SSD method is not limited thereto, and the disclosure may also be applied in a display device in which an SSD method having multiplicity of two or not less than four is employed.

In the above description, the organic EL display devices are exemplified to describe the embodiments and the modification examples thereof, but the disclosure is not limited to the organic EL display devices, and may be applied to any display device using a display element driven by a current. The display element that can be used in such a configuration is a display element in which luminance, transmittance, or other factors are controlled by a current and includes, for example, an organic EL element, that is, an organic light-emitting diode (OLED), or an inorganic light-emitting diode, a quantum dot light-emitting diode (QLED) or the like.

REFERENCE SIGNS LIST 10a to 10e Organic EL display device
11 Display portion
13 Terminal portion
15 Pixel circuit
100 Display panel
Pix(i, j) Pixel circuit (i=1 to N, j=1 to M)
Pr(i, j) R pixel circuit (i=1 to N, j=1 to M)
Pg(i, j) G pixel circuit (i=1 to N, j=1 to M)
Pb(i, j) B pixel circuit (i=1 to N, j=1 to M)
20 Display control circuit
30 Data-side drive circuit (data signal line drive circuit)
40 Scanning-side drive circuit (scanning signal line drive/light emission control circuit)
50 Power supply circuit
Gi Scanning signal line (i=1 to N)
Ei Light emission control line (i=1 to N)
Dj Data signal line (j=1 to M)
ELVDD High-level power supply line (first power supply voltage line), High-level power supply voltage
ELV0 Main wiring line (of high-level power supply line)
ELVj Trunk wiring line (of high-level power supply line) (j=1 to M or j=1 to N)
ELVHi Branch wiring line (of high-level power supply line) (i=1 to N)
ELVSS Low-level power supply line (second power supply voltage line), Low-level power supply voltage
PS, PS1, PS2, PSm Power supply point
CNi Connection point (between trunk wiring line and branch wiring line) (i=1 to N)
CHi Contact hole (of trunk wiring line and branch wiring line) (i=1 to N)
OL Organic EL element
C1 Holding capacitor
M1 Drive transistor M2 Write control transistor (write control switching element)

M3 Threshold compensation transistor (threshold compensation switching element)

M4 First initialization transistor (first initialization switching element)

M5 First light emission control transistor (first light emission control switching element)

M6 Second light emission control transistor (second light emission control switching element)

M7 Second initialization transistor (second initialization switching element)

The invention claimed is:

1. A display device including a display portion in which a plurality of scanning signal lines extends in a row direction, a plurality of data signal lines extends in a column direction intersecting the plurality of scanning signal lines, and a plurality of pixel circuits arranges in a matrix shape along the plurality of scanning signal lines and the plurality of data signal lines, the display device further comprising:
power supply lines including a first power supply voltage line and a second power supply voltage line;
a data signal line drive circuit configured to drive the plurality of data signal lines; and
a scanning signal line drive circuit configured to selectively drive the plurality of scanning signal lines,
wherein the first power supply voltage line includes
a main wiring line provided in a frame region adjacent to the display portion and extending in the row direction,
a plurality of trunk wiring lines branching off from the main wiring line and extending in the column direction, and
a plurality of branch wiring lines each disposed along each of the plurality of scanning signal lines,
each of the plurality of pixel circuits corresponds to one of the plurality of scanning signal lines, to one of the plurality of data signal lines, and to one of the plurality of branch wiring lines, and includes a display element driven by a current, a holding capacitor configured to hold a data voltage for controlling a drive current of the display element, and a drive transistor configured to control the drive current of the display element in accordance with the data voltage held in the holding capacitor,
in each of the plurality of pixel circuits, a first conduction terminal of the drive transistor is connected to a branch wiring line of the plurality of branch wiring lines corresponding to the pixel circuit, a second conduction terminal of the drive transistor is connected to the second power supply voltage line via the display element, and a control terminal of the drive transistor is connected to the branch wiring line corresponding to the pixel circuit via the holding capacitor,
the display portion includes
a wiring line layer in which the plurality of branch wiring lines is formed,
another wiring line layer in which the plurality of trunk wiring lines is formed,
an insulating layer sandwiched between the plurality of branch wiring lines and the plurality of trunk wiring lines, and
a plurality of contact holes provided in the insulating layer in such a manner that each of the plurality of branch wiring lines is electrically connected conductively to at least one trunk wiring line among the plurality of trunk wiring lines, and each of the plurality of trunk wiring lines is electrically connected conductively to only some branch wiring lines among the plurality of branch wiring lines,
the plurality of pixel circuits is pixel circuits arranged in N rows and M columns, where N and M are each an integer of not less than two,
a number of the branch wiring lines is N,
a number of the trunk wiring lines is M,
each of the plurality of branch wiring lines is connected to M pixel circuits among the plurality of pixel circuits, the M pixel circuits disposed along the branch wiring line, and
the plurality of contact holes is provided in the insulating layer in such a manner that each of the plurality of trunk wiring lines is electrically connected conductively to N−1 or less of the branch wiring lines among the plurality of branch wiring lines.

2. The display device according to claim 1,
wherein each of the plurality of trunk wiring lines extends in the column direction in such a manner as to intersect all of the plurality of scanning signal lines.

3. The display device according to claim 2,
wherein the plurality of contact holes is provided in the insulating layer in such a manner that, among the plurality of branch wiring lines, a branch wiring line that is closer to the main wiring line is electrically connected conductively to a trunk wiring line that is closer to a center position in the row direction.

4. The display device according to claim 3,
wherein the plurality of branch wiring lines comprises a first branch wiring line and a second branch wiring line,
in a case that a distance between the first branch wiring line and the main wiring line is shorter than a distance between the second branch wiring line and the main wiring line, the first branch wiring line and the second branch wiring line are respectively electrically connected conductively to a first trunk wiring line and a second trunk wiring line disposed on one side of the center position in the row direction,
the plurality of branch wiring lines further includes at least one branch wiring line between the first branch wiring line and the second branch wiring line, and
the at least one branch wiring line includes a third branch wiring line that is electrically connected conductively to a third trunk wiring line disposed on another side of the center position in the row direction.

5. The display device according to claim 2,
wherein the plurality of contact holes is provided in the insulating layer in such a manner that, among the plurality of branch wiring lines, a branch wiring line that is farther from the main wiring line, is electrically connected conductively to the trunk wiring line that is closer to a center position in the row direction.

6. The display device according to claim 5,
wherein the plurality of branch wiring lines comprises a first branch wiring line and a second branch wiring line,
in a case that a distance between the first branch wiring line and the main wiring line is shorter than a distance between the second branch wiring line and the main wiring line, the first branch wiring line and the second branch wiring line are respectively electrically connected conductively to a first trunk wiring line and a second trunk wiring line disposed on one side of the center position in the row direction, the plurality of branch wiring lines further includes at least one branch wiring line disposed between the first branch wiring line and the second branch wiring line, and the at least one branch wiring line includes a third branch wiring line that is electrically connected conductively to a third trunk wiring line disposed on another side of the center position in the row direction.

7. The display device according to claim 1,
wherein the plurality of contact holes is provided in the insulating layer in such a manner that, among the plurality of trunk wiring lines, a trunk wiring line that is closer to a power supply point, that is a location at which a first power supply voltage to be supplied by the first power supply voltage line is supplied to the main wiring line, is electrically connected conductively to a branch wiring line in the plurality of branch wiring lines that is farther from the main wiring line.

8. The display device according to claim 1,
wherein the plurality of trunk wiring lines is configured such that a trunk wiring line in the plurality of trunk wiring lines that is closer to a center position in the row direction is shorter in length.

9. The display device according to claim 8,
wherein the plurality of contact holes is provided in the insulating layer in such a manner that one end of each of the plurality of trunk wiring lines is electrically connected conductively to the main wiring line, and another end of each of the plurality of trunk wiring lines is electrically connected conductively to some corresponding branch wiring lines in the plurality of branch wiring lines.

10. The display device according to claim 8,
wherein the display portion further includes a terminal portion configured to receive a first power supply voltage to be supplied by the first power supply voltage line, and a power supply wiring line configured to allow the first power supply voltage given to the terminal portion to be supplied to both ends of the main wiring line.

11. The display device according to claim 1,
wherein the plurality of trunk wiring lines is configured such that as a trunk wiring line in the plurality of trunk wiring lines that is closer to a center position in the row direction is longer in length.

12. A display device including a display portion in which a plurality of scanning signal lines extends in a row direction, a plurality of data signal lines extends in a column direction intersecting the plurality of scanning signal lines, and a plurality of pixel circuits arranges in a matrix shape along the plurality of scanning signal lines and the plurality of data signal lines, the display device further comprising:
power supply lines including a first power supply voltage line and a second power supply voltage line;
a data signal line drive circuit configured to drive the plurality of data signal lines; and
a scanning signal line drive circuit configured to selectively drive the plurality of scanning signal lines,
wherein the first power supply voltage line includes
a main wiring line provided in a frame region adjacent to the display portion and extending in the row direction,
a plurality of trunk wiring lines branching off from the main wiring line and extending in the column direction, and
a plurality of branch wiring lines each disposed along each of the plurality of scanning signal lines, each of the plurality of pixel circuits corresponds to one of the plurality of scanning signal lines, to one of the plurality of data signal lines, and to one of the plurality of branch wiring lines, and includes a display element driven by a current, a holding capacitor configured to hold a data voltage for controlling a drive current of the display element, and a drive transistor configured to control the drive current of the display element in accordance with the data voltage held in the holding capacitor, in each of the plurality of pixel circuits, a first conduction terminal of the drive transistor is connected to a branch wiring line of the plurality of branch wiring lines corresponding to the pixel circuit, a second conduction terminal of the drive transistor is connected to the second power supply voltage line via the display element, and a control terminal of the drive transistor is connected to the branch wiring line corresponding to the pixel circuit via the holding capacitor, the display portion includes
a wiring line layer in which the plurality of branch wiring lines is formed,
another wiring line layer in which the plurality of trunk wiring lines is formed,
an insulating layer sandwiched between the plurality of branch wiring lines and the plurality of trunk wiring lines, and
a plurality of contact holes provided in the insulating layer in such a manner that each of the plurality of branch wiring lines is electrically connected conductively to at least one trunk wiring line among the plurality of trunk wiring lines, and each of the plurality of trunk wiring lines is electrically connected conductively to only some branch wiring lines among the plurality of branch wiring lines, the plurality of contact holes is provided in the insulating layer in such a manner that each of the plurality of trunk wiring lines is electrically connected conductively to only one branch wiring line among the plurality of branch wiring lines.

13. The display device according to claim 12,
wherein the one branch wiring line is further electrically connected conductively to another trunk wiring line.

14. The display device according to claim 13,
wherein each of the plurality of trunk wiring lines extends in the column direction in such a manner as to intersect all of the plurality of scanning signal lines.

15. The display device according to claim 13,
wherein the plurality of contact holes is provided in the insulating layer in such a manner that, among the plurality of trunk wiring lines, a trunk wiring line that is closer to a power supply point, that is a location at which a first power supply voltage to be supplied by the first power supply voltage line is supplied to the main wiring line, is electrically connected conductively to a branch wiring line in the plurality of branch wiring lines that is farther from the main wiring line.

16. The display device according to claim 12,
wherein each of the plurality of trunk wiring lines extends in the column direction in such a manner as to intersect all of the plurality of scanning signal lines.

17. The display device according to claim 12,
wherein the plurality of contact holes is provided in the insulating layer in such a manner that, among the plurality of trunk wiring lines, a trunk wiring line that is closer to a power supply point, that is a location at which a first power supply voltage to be supplied by the first power supply voltage line is supplied to the main wiring line, is electrically connected conductively to a branch wiring line in the plurality of branch wiring lines that is farther from the main wiring line.

18. A display device including a display portion in which a plurality of scanning signal lines extends in a row direction, a plurality of data signal lines extends in a column direction intersecting the plurality of scanning signal lines, and a plurality of pixel circuits arranges in a matrix shape along the plurality of scanning signal lines and the plurality of data signal lines, the display device further comprising:

power supply lines including a first power supply voltage line and a second power supply voltage line;

a data signal line drive circuit configured to drive the plurality of data signal lines; and a scanning signal line drive circuit configured to selectively drive the plurality of scanning signal lines, wherein the first power supply voltage line includes a main wiring line provided in a frame region adjacent to the display portion and extending in the row direction, a plurality of trunk wiring lines branching off from the main wiring line and extending in the column direction, and a plurality of branch wiring lines each disposed along each of the plurality of scanning signal lines, each of the plurality of pixel circuits corresponds to one of the plurality of scanning signal lines, to one of the plurality of data signal lines, and to one of the plurality of branch wiring lines, and includes a display element driven by a current, a holding capacitor configured to hold a data voltage for controlling a drive current of the display element, and a drive transistor configured to control the drive current of the display element in accordance with the data voltage held in the holding capacitor, in each of the plurality of pixel circuits, a first conduction terminal of the drive transistor is connected to a branch wiring line of the plurality of branch wiring lines corresponding to the pixel circuit, a second conduction terminal of the drive transistor is connected to the second power supply voltage line via the display element, and a control terminal of the drive transistor is connected to the branch wiring line corresponding to the pixel circuit via the holding capacitor, the display portion includes a wiring line layer in which the plurality of branch wiring lines is formed, another wiring line layer in which the plurality of trunk wiring lines is formed, an insulating layer sandwiched between the plurality of branch wiring lines and the plurality of trunk wiring lines, and a plurality of contact holes provided in the insulating layer in such a manner that each of the plurality of branch wiring lines is electrically connected conductively to at least one trunk wiring line among the plurality of trunk wiring lines, and each of the plurality of trunk wiring lines is electrically connected conductively to only some but at least two branch wiring lines among the plurality of branch wiring lines, the plurality of contact holes is provided in the insulating layer in such a manner that each of the plurality of trunk wiring lines is electrically connected conductively to at least two branch wiring lines among the plurality of branch wiring lines, each of the plurality of pixel circuits is configured such that, in a case that a scanning signal line of the plurality of signal lines corresponding to a pixel circuit that corresponds to one branch wiring line of the at least two branch wiring lines is selected, the pixel circuit corresponding to another branch wiring line of the at least two branch wiring lines is also set to be in a non-light emission state.

* * * * *